(12) United States Patent
Tinnemans et al.

(10) Patent No.: US 12,366,811 B2
(45) Date of Patent: *Jul. 22, 2025

(54) METROLOGY SYSTEM AND METHOD FOR DETERMINING A CHARACTERISTIC OF ONE OR MORE STRUCTURES ON A SUBSTRATE

(71) Applicant: ASML Netherlands B.V., Veldhoven (NL)

(72) Inventors: Patricius Aloysius Jacobus Tinnemans, Hapert (NL); Arie Jeffrey Den Boef, Waalre (NL); Armand Eugene Albert Koolen, Nuth (NL); Nitesh Pandey, Eindhoven (NL); Vasco Tomas Tenner, Amsterdam (NL); Willem Marie Julia Marcel Coene, Geldrop (NL); Patrick Warnaar, Tilburg (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/650,790

(22) Filed: Apr. 30, 2024

(65) Prior Publication Data
US 2024/0319620 A1    Sep. 26, 2024

Related U.S. Application Data

(63) Continuation of application No. 17/856,213, filed on Jul. 1, 2022, now Pat. No. 12,007,700, which is a
(Continued)

(30) Foreign Application Priority Data

Oct. 5, 2017 (EP) .................................... 17194905
Nov. 2, 2017 (EP) .................................... 17199764
Dec. 13, 2017 (EP) .................................... 17206967

(51) Int. Cl.
*G03F 7/00* (2006.01)
*G01B 11/02* (2006.01)
(Continued)

(52) U.S. Cl.
CPC ............ *G03F 7/7085* (2013.01); *G01B 11/02* (2013.01); *G01B 11/0625* (2013.01);
(Continued)

(58) Field of Classification Search
CPC .... G03F 7/7085; G03F 7/70158; G03F 7/705; G03F 7/70625; G03F 7/70633;
(Continued)

(56) References Cited

U.S. PATENT DOCUMENTS 6,952,253 B2    10/2005    Lof et al.
7,345,739 B2    3/2008     Hendriks et al.
(Continued)

FOREIGN PATENT DOCUMENTS

CN    1527139 A      9/2004
CN    103748515 A    4/2014
(Continued)

OTHER PUBLICATIONS

Cardinal D., "Apple iphone 7 Plus's new dual camera: Computational imaging finally goes mainstream," accessed at https://www.extremetech.com/electronics/235226-apple-iphone-7-pluss-new-dual-camera-computational-imaging-finally-goes-mainstream; Sep. 8, 2016; 14 pages.
(Continued)

*Primary Examiner* — Jamil Ahmed
(74) *Attorney, Agent, or Firm* — Sterne, Kessler, Goldstein & Fox P.L.L.C.

(57) ABSTRACT

Described is a metrology system for determining a characteristic of interest relating to at least one structure on a substrate, and associated method. The metrology system comprises a processor being configured to computationally determine phase and amplitude information from a detected characteristic of scattered radiation having been reflected or scattered by the at least one structure as a result of illumination of said at least one structure with illumination radiation in a measurement acquisition, and use the determined phase and amplitude to determine the characteristic of interest.

20 Claims, 5 Drawing Sheets

Related U.S. Application Data continuation of application No. 17/022,910, filed on Sep. 16, 2020, now Pat. No. 11,415,900, which is a continuation of application No. 16/150,879, filed on Oct. 3, 2018, now Pat. No. 10,816,909.

(51) Int. Cl.

| | |
|---|---|
| *G01B 11/06* | (2006.01) |
| *G01N 21/47* | (2006.01) |
| *G01N 21/95* | (2006.01) |
| *G03F 9/00* | (2006.01) |

(52) U.S. Cl.
CPC ..... *G01N 21/4788* (2013.01); *G01N 21/9501* (2013.01); *G03F 7/70158* (2013.01); *G03F 7/705* (2013.01); *G03F 7/70625* (2013.01); *G03F 7/70633* (2013.01); *G03F 9/7088* (2013.01); *G01B 2210/56* (2013.01)

(58) Field of Classification Search
CPC ... G03F 9/7088; G01B 11/02; G01B 11/0625; G01B 2210/56; G01N 21/4788; G01N 21/9501
See application file for complete search history.

(56) References Cited

U.S. PATENT DOCUMENTS

| | | | |
|---|---|---|---|
| 8,786,825 B2 | 7/2014 | Van De Kerkhof et al. | |
| 9,069,264 B2 | 6/2015 | Warnaar et al. | |
| 10,816,909 B2 | 10/2020 | Tinnemans et al. | |
| 11,415,900 B2 | 8/2022 | Tinnemans et al. | |
| 2004/0169861 A1 | 9/2004 | Mieher et al. | |
| 2010/0328655 A1 | 12/2010 | Den Boef et al. | |
| 2011/0026032 A1 | 2/2011 | Den Boef et al. | |
| 2011/0102753 A1 | 5/2011 | Van De Kerkhof et al. | |
| 2011/0178785 A1 | 7/2011 | Tinnemans et al. | |
| 2011/0249244 A1 | 10/2011 | Leewis et al. | |
| 2012/0044470 A1 | 2/2012 | Smilde et al. | |
| 2012/0243004 A1* | 9/2012 | El Gawhary | G01B 11/24 356/601 |
| 2014/0169524 A1 | 6/2014 | Sperl et al. | |
| 2014/0242880 A1 | 8/2014 | David | |
| 2016/0061750 A1 | 3/2016 | Den Boef et al. | |
| 2016/0161863 A1 | 6/2016 | Den Boef et al. | |
| 2017/0097575 A1 | 4/2017 | Pandey et al. | |
| 2017/0261428 A1 | 9/2017 | Coene et al. | |
| 2018/0109717 A1 | 4/2018 | Wang et al. | |
| 2018/0340886 A1 | 11/2018 | Sezginer et al. | |
| 2019/0107781 A1 | 4/2019 | Tinnemans et al. | |
| 2021/0003924 A1 | 1/2021 | Tinnemans et al. | |
| 2023/0062585 A1 | 3/2023 | Tinnemans et al. | |

FOREIGN PATENT DOCUMENTS

| | | |
|---|---|---|
| CN | 105425411 A | 3/2016 |
| EP | 1 628 164 A2 | 2/2006 |
| JP | 2006-509219 A | 3/2006 |
| WO | WO 2004/053426 A1 | 6/2004 |
| WO | WO 2011/012624 A1 | 2/2011 |

OTHER PUBLICATIONS

Beck et al., "A Fast Iterative Shrinkage-Thresholding Algorithm for Linear Inverse Problems*," Society for Industrial and Applied Mathematics, SIAM Journal of Imaging Sciences, vol. 2, No. 1, 2009; pp. 183-202.
Becker et al., "A quasi-Newton proximal splitting method," Proceedings of the 25th International Conference on Neural Information Processing Systems, vol. 2, 2012, pp. 1-9.
Braat et al., "Double Zernike expansion of the optical aberration function from its power series expansion," Journal of the Optical Society of America A, vol. 30, No. 6, Apr. 15, 2013; pp. 1-18.
Candes et al., "Robust Uncertainty Principles: Exact Signal Reconstruction from Highly Incomplete Frequency Information," Jun. 10, 2004; pp. 1-39.
Chen et al., "A primal-dual fixed point algorithm for convex separable minimization with applications to image restoration," Inverse Problems, vol. 29, Jan. 17, 2013; pp. 1-33.
Combettes et al., "Proximal Splitting Methods in Signal Processing*," 2011; pp. 1-25.
Duran et al., "Collaborative Total Variation: A General Framework for Vectorial TV Models*," Aug. 7, 2015; pp. 1-33.
Shechtman et al., "Phase Retrieval with Application to Optical Imaging," IEEE Signal Processing Magazine, Apr. 6, 2015; pp. 87-109.
Fienup et al., "Comparison of Phase Diversity and Curvature Wavefront Sensing," SPIE Conference on Adaptive Optical System Technologies, SPIE vol. 3353, Mar. 1998; pp. 930-940.
Garcia-Vergara et al., "Extracting an accurate model for permittivity from experimental data : Hunting complex poles from the real line," Optical Letters, vol. 42, No. 6, 2017; pp. 1-6.
Goldluecke et al., "The Natural Vectorial Total Variation Which Arises from Geometric Measure Theory*," Society for Industrial and Applied Mathematics, SIAM Journal of Imaging Sciences, vol. 5, No. 2, 2012; pp. 537-563.
Komodakis et al., "Playing with Duality: An Overview of Recent Primal-Dual Approaches for Solving Large-Scale Optimization Problems," IEEE Signal Processing Magazine, Dec. 4, 2014; pp. 1-43.
Lee et al., "Detecting Boundaries in a Vector Field," IEEE Transactions on Signal Processing, vol. 39, No. 5, May 1991; pp. 1181-1194.
Lee et al., "Proximal Newton-type methods for convex optimization," 2012, pp. 1-9.
Nugent K.A., "A generalization of Schell's theorem," Optics Communications, vol. 79, No. 5, Nov. 1, 1990; pp. 267-269.
O'Donoghue et al., "Adaptive Restart for Accelerated Gradient Schemes," Apr. 19, 2012; pp. 1-17.
Onose et al., "An accelerated splitting algorithm for radio-interferometric imaging: when natural and uniform weighting meet," Monthly Notices of the Royal Astronomical Society, 2017; pp. 1-13.
Parikh et al., "Proximal Algorithms," Foundations and Trend in Optimization, vol. 1, No. 3, 2013; 113 pages.
Rudin et al., "Nonlinear total variation based noise removal algorithms," Physica D, vol. 60, 1992, pp. 259-268.
Shakibaei et al., "Recursive formula to compute Zernike radial polynomials," Optics Letters, vol. 38, No. 14, Jul. 15, 2013; pp. 2487-2489.
Sun et al., "A Geometric Analysis of Phase Retrieval," Foundations of Computational Mathematics, vol. 18, No. 5, Feb. 22, 2016; pp. 1-61.
Zhong et al., "Nonlinear Optimization Algorithm for Partially Coherent Phase Retrieval and Source Recovery," IEEE Transactions on Computational Imaging, vol. 2, No. 3, Sep. 2016; pp. 310-322.
Balanis C.A., Antenna Theory: Analysis and Design, 4th Edition, 1982; pp. 106-107.
Liu et al., "Computational optical coherence tomography," Biomedical Optics Express, vol. 8, No. 3, Mar. 1, 2017; pp. 1549-1574.
Bauschke et al., "Phase retrieval, error reduction algorithm, and Fienup variants: a view from convex optimization," Optical Society of America Journal A, vol. 19, No. 7, Jul. 2002; pp. 1334-1345.
Saleh et al., "Fundamentals of Photonics," Dec. 2001; p. 358.
Mallot S., "A Wavelet Tour of Signal Processing: The Sparse Way," $3^{rd}$ Edition, 2009; p. 49.
Goodman J.W., "Statistical Optics," 2000, pp. 220, 225, 312, and 318.
Goodman J.W., "Introduction to Fourier Optics," $2^{nd}$ Edition, 1996; p. 50.
Boyd et al., "Convex Optimization," Cambridge University Press, 2004, p. 93.
Born et al., "Principles of Optics," $7^{th}$ Edition, 1999, p. 413.
Menchtchikov et al., "Reduction in overlay error from mark asymmetry using simulation, ORION, and alignment models," Optical Microlithography XXXI, SPIE Advanced Lithography, vol. 10587, 2018; pp. 1-11.

(56) References Cited

OTHER PUBLICATIONS

International Search Report directed to related International Patent Application No. PCT/EP2018/075239, mailed Dec. 4, 2018; 5 pages.
Mochi et al., "Actinic imaging and evaluation of phase structures on EUV lithography masks," Journal of Vacuum Science & Technology B, vol. 28, Nov. 18, 2010; 22 pages.
Written Opinion of the International Searching Authority directed to related International Patent Application No. PCT/EP2018/075239, mailed Dec. 4, 2018; 7 pages.
International Preliminary Report on Patentability directed to related International Patent Application No. PCT/EP2018/075239, issued Apr. 8, 2020; 8 pages.
Extended European Search Report for Application No. 17199764.6, dated May 3, 2018; 2 pages.

* cited by examiner

METROLOGY SYSTEM AND METHOD FOR DETERMINING A CHARACTERISTIC OF ONE OR MORE STRUCTURES ON A SUBSTRATE

CROSS REFERENCES TO RELATED APPLICATIONS

This application is a continuation of U.S. patent application Ser. No. 17/856,213, filed Jul. 1, 2022, which is a continuation of U.S. patent application Ser. No. 17/022,910, filed Sep. 16, 2020, now U.S. Pat. No. 11,415,900, issued Aug. 16, 2022, which is a continuation of U.S. patent application Ser. No. 16/150,879, filed Oct. 3, 2018, now U.S. Pat. No. 10,816,909, issued Oct. 27, 2020, which claims the benefit of EP application Ser. No. 17/206,967.6, filed Dec. 13, 2017, EP application Ser. No. 17/199,764.6, filed Nov. 2, 2017, and EP application Ser. No. 17/194,905.0, filed Oct. 5, 2017, which are all hereby incorporated herein in their entireties by reference.

FIELD

The present invention relates to a metrology system or an inspection system for determining a characteristic of structures on a substrate. The present invention also relates to a method for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low $k_1$.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses. In specific embodiments relatively small wavelength ranges of the visible light spectrum is used for the inspection of the structures manufactured on the substrate and there is a need to move to higher and to lower wavelengths and there is a need to use broader wavelength ranges during a single measurement. In specific embodiments, the optical system of the inspection or metrology apparatus has a relative high NA. In specific embodiments of the optical system, stray light and/or ghosting may be a problem. In specific embodiment dark-field imaging is used and the amount of recorded noise may be too high in certain cases. It may be possible to provide solutions for the above discussed requirements and/or to provide a solution for the above discussed problems by improving the quality of the optical elements used in the inspection or metrology apparatus. A problem is that, for example, aberration requirements over a wide wavelength range become very strict. This may result in optical elements that cannot be manufactured or may result in optical elements that become too expensive for the metrology or inspection apparatus.

SUMMARY

It is an object to provide an effective an efficient solution for an inspection or metrology system or apparatus that solves one or more of the above discussed problems or limitations.

Embodiments of the invention are disclosed in the claims and in the detailed description.

In a first aspect of the invention there is provided a metrology system for determining a characteristic of interest relating to at least one structure on a substrate, the metrology apparatus comprising: a processor being configured to: computationally determine phase and amplitude information from a detected characteristic of scattered radiation having been reflected or scattered by the at least one structure as a result of illumination of said at least one structure with illumination radiation in a measurement acquisition, and use the determined phase and amplitude to determine the characteristic of interest.

In a second aspect of the invention there is provided a method of determining a characteristic of interest relating to at least one structure on a substrate, method comprising: computationally determining phase and amplitude information from a detected characteristic of scattered radiation having been reflected or scattered by the at least one structure as a result of illumination of said at least one structure with illumination radiation in a measurement acquisition, and using the determined phase and amplitude to determine the characteristic of interest

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
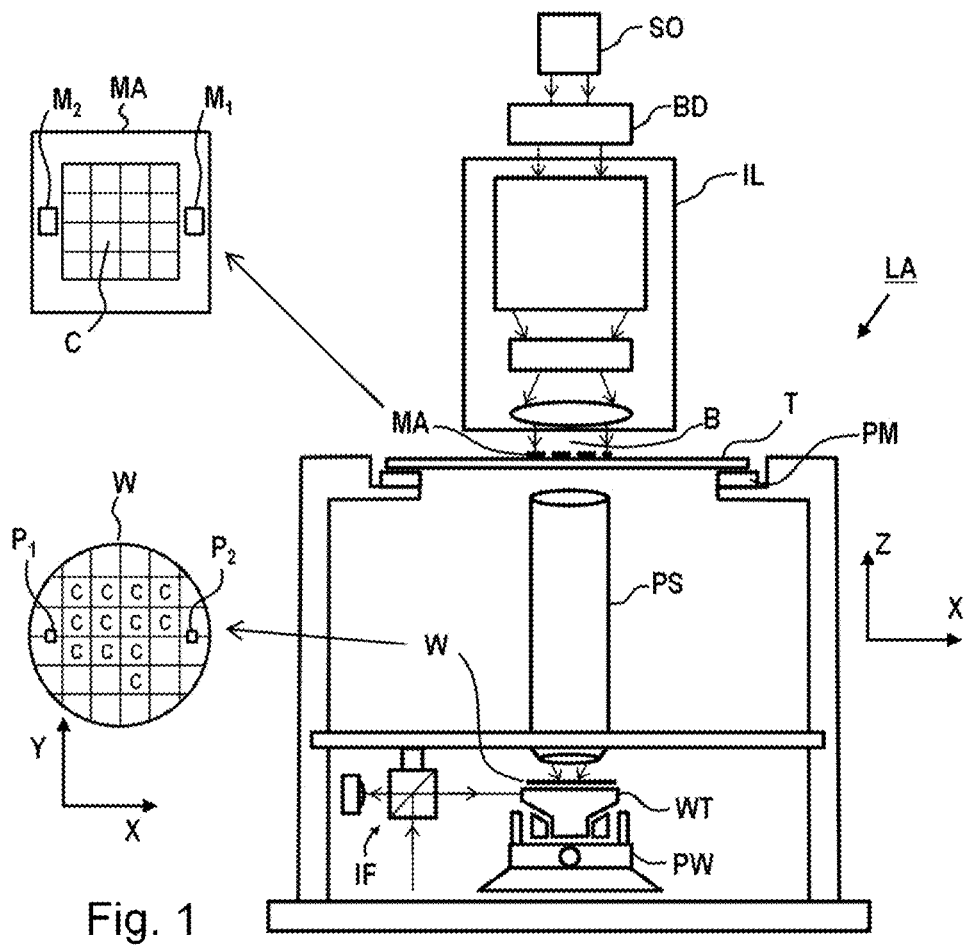
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W-which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
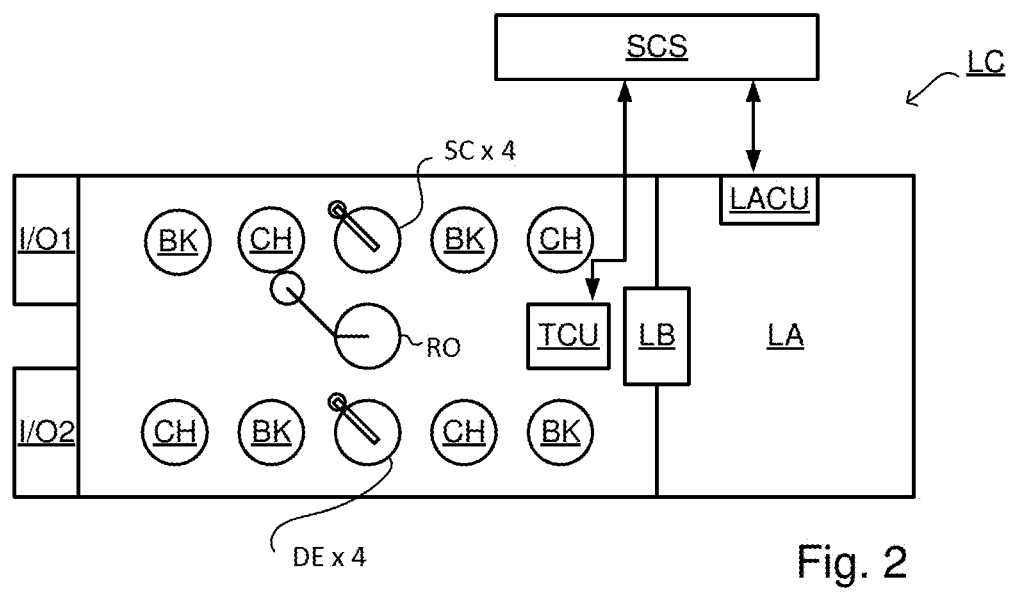
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
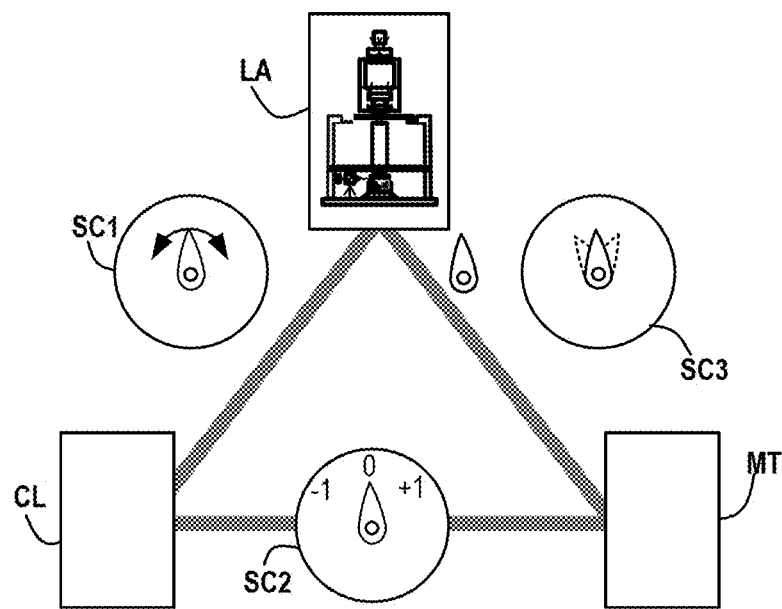
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers can measure in one image multiple targets from multiple gratings using light from soft x-ray and visible to near-IR wave range.

Figure 4:
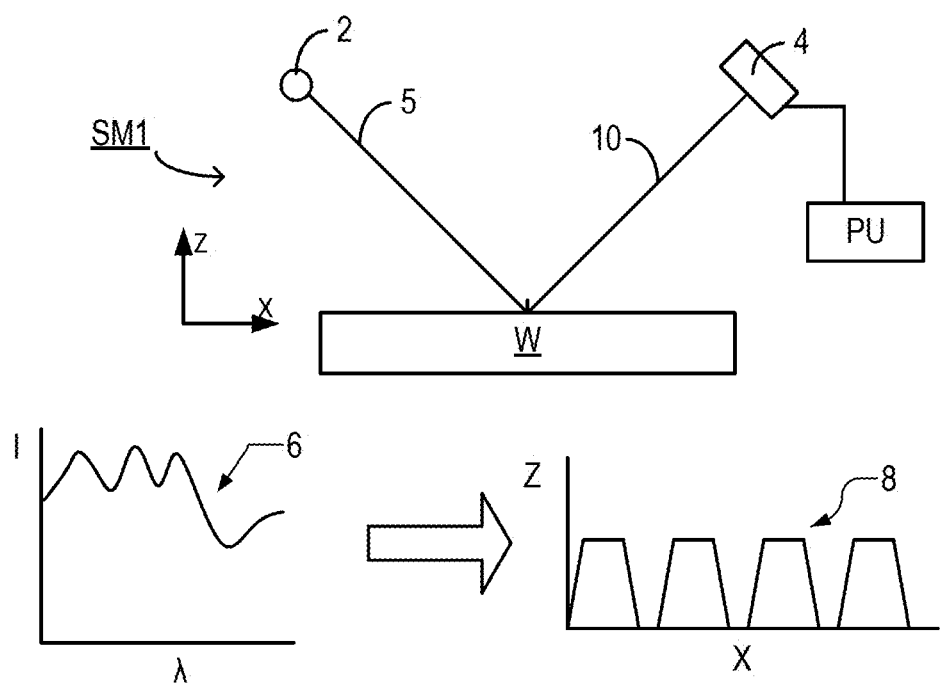
FIG. 4 illustrates an inspection apparatus according to an embodiment of the invention.

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength $\lambda$) of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

EUV Spectroscopic Reflectometry

Figure 5:
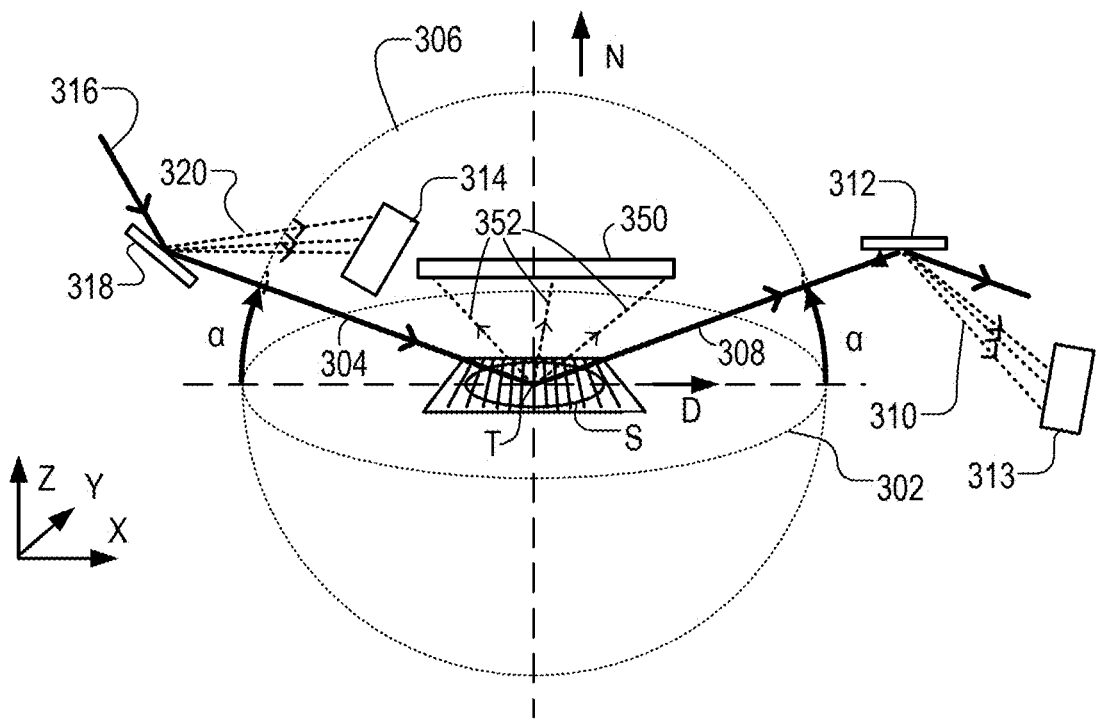
FIG. 5 schematically depicts a metrology method using EUV radiation.
Figure 6:
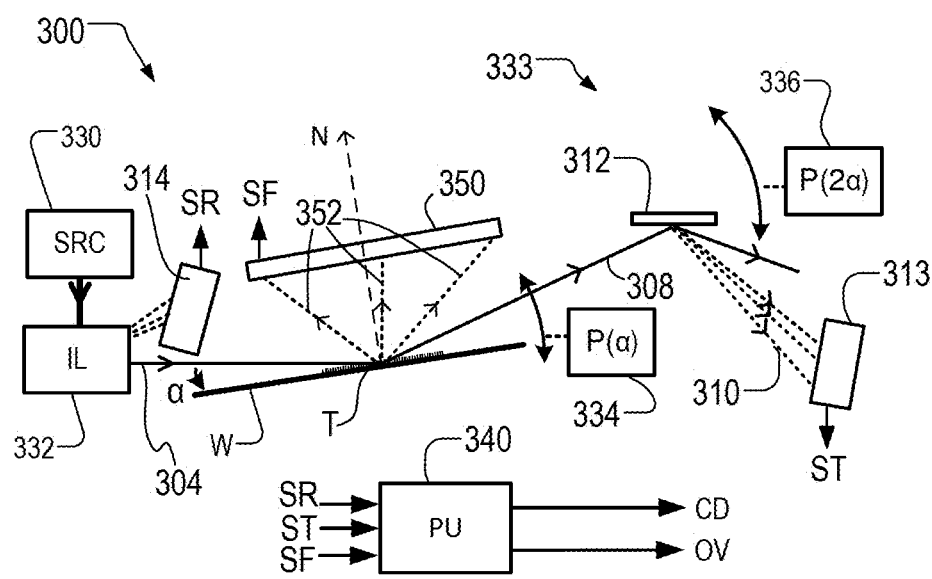
FIG. 6 schematically depicts an EUV metrology device according to an embodiment of the invention.

FIG. 5 illustrates an EUV metrology method while FIG. 6 illustrates an EUV metrology apparatus 300. The apparatus can be used as an example of EUV metrology apparatus 244 for measuring parameters of substrates W processed in the manufacturing system of FIG. 1. The illumination radiation used by EUV metrology apparatus may comprise radiation in the wavelength range from 0.1 to 100 nm, or, optionally, in the wavelength range from 1 to 100 nm or, optionally, in the wavelength range from 1 to 50 nm, or optionally, in the wavelength range from 10 to 20 nm.

In FIG. 5, the target T is represented schematically as comprising a one-dimensional grating structure at the origin of a spherical reference frame. Axes X, Y and Z are defined relative to the target. (Of course any arbitrary coordinate system can be defined in principle, and each component may have its own local reference frame, that can be defined relative to the one shown.) The direction of periodicity D of the target structure is aligned with the X axis. The drawing is not a true perspective drawing, but a schematic illustration only. The X-Y plane is the plane of the target and substrate, and for clarity is shown tilted toward the viewer, represented by an oblique view of circle 302. The Z direction defines the direction N normal to the substrate. In FIG. 5, one of the incident rays is labeled 304 and has an angle α of grazing incidence. In this example, the incident ray 304 (and all incident rays forming the radiation spot S) lie substantially in a plane parallel to the X-Z plane, that is a plane defined the directions D and N and represented by circle 306. A reflected ray 308 that is not scattered by the periodic structure of the target T emerges towards the right hand side of the target in the diagram, with an elevation angle α.

To perform spectroscopic reflectometry, ray 308 and other reflected rays are broken into a spectrum 310, comprising rays of different wavelengths. The spectrum may be produced for example using a grazing incidence diffraction grating 312. The spectrum is detected by a spectrum detector 313. This spectrum detector 313, which may for example be a CCD image detector having an array of pixels, is used to transform the spectrum into electrical signals and eventually digital data for analysis.

In addition to spectrum 310, higher (non-zero) diffraction orders 352 (e.g., at least the +1 and −1 orders, and possibly other higher orders) may be detected using a diffraction order detector 350. While one diffraction order detector 350 is shown here, more than one higher order detector may be used; for example, a first higher order detector for the +1 order, and a second higher order detector for the −1 order. Diffraction order detector 350 may for example be a CCD image detector having an array of pixels.

In a practical system, the spectrum of radiation 304 may be subject to time variations, which would disturb the analysis. In order to normalize the detected spectrum 310 and/or higher diffraction orders 352 against these variations, a reference spectrum is captured by a reference spectrum detector 314. To produce the reference spectrum, source radiation 316 is diffracted by another diffraction grating 318. A zero order reflected ray of grating 318 forms the incident ray 304, while the first order diffracted rays 320 of grating 318 form the reference spectrum detected by reference spectrum detector 314. Electrical signals and data representing the reference spectrum are obtained for use in the analysis.

From the measured spectrum 310 and/or higher diffraction orders 352, obtained for one or more values of incidence angle α, a measurement of a property of the target structure T can be calculated in a manner described further below.

Turning to FIG. 6, EUV metrology apparatus 300 is provided for measuring properties of a metrology target T formed on substrate W, by the method of FIG. 5. Various hardware components are represented schematically. The practical implementation of these components can be performed by the relevant skilled persons applying a mixture of existing components and specially-designed components, according to well-known design principles. A support (not shown in detail) is provided for holding the substrate at a desired position and orientation relative to other components to be described. A radiation source 330 provides radiation to an illumination system 332. Illumination system 332 provides a beam of EUV illumination radiation represented by ray 304 which forms a focused irradiation spot on target T. Illumination system 332 also provides the reference spectrum 320 to reference spectrum detector 314. Components 312, 313 etc. may be conveniently considered as a spectrum detection system 333.

Substrate W in this example is mounted on a movable support having a positioning system 334 such that an angle of incidence a of ray 304 can be adjusted and/or the x, y, z position of the substrate W can be adjusted. In this example, it is chosen as a matter of convenience to tilt the substrate W to change the incidence angle, while the source 330 and illumination system 332 remain stationary. In order to catch the reflected ray 308, detection system 333 is provided with a further movable support 336, so that it moves through an angle 2a relative to the stationary illumination system, or through an angle α relative to the substrate. In the grazing incidence regime of reflectometry, it is convenient to define the incidence angle α by reference to the plane of the substrate, as shown. Of course, it could equally be defined as an angle between the direction of incidence of incident ray I and a direction N normal to the substrate.

Additional actuators, not shown, are provided for bringing each target T into a position where the focused spot S of radiation is located. (Looking at it another way, to bring the spot to the position where the target is located.) In a practical application, there may be a succession of individual targets or target locations to be measured on a single substrate, and a succession of substrates too. It is immaterial, in principle, whether the substrate and target are moved and reoriented while the illumination system and detectors 313, 350 stay still, or whether the substrate stays still while the illumination system and detectors 313, 350 are moved, or whether different components of the relative movement are achieved by a combination of these techniques. The present disclosure encompasses all these variants.

As already described with reference to FIG. 5, the radiation reflected by target T and substrate W is split into a spectrum 310 of rays of different wavelengths, before it impinges on spectrum detector 313. Spectrum detector 313 and/or diffraction order detector 350 comprises for example a position-sensitive EUV detector, typically an array of detector elements. In each case, the array may be a linear array, but in practice a 2-dimensional array of elements (pixels) may be provided. Spectrum detector 313 and/or diffraction order detector 350 may be for example a CCD (charge coupled device) image sensor.

A processor 340 receives signals from the detectors 350, 313 and 314. In particular, signal ST from spectrum detector 313 represents the target spectrum, signals SF from diffraction order detector 350 represents the higher order diffraction patterns and signal SR from detector 314 represents the reference spectrum. Processor 340 can subtract the reference spectrum from the target spectrum to obtain a reflection spectrum of the target, normalized against variation in the source spectrum. The resulting reflection spectra for one or more angles of incidence are used in the processor to calculate a measurement of property of the target, for example CD or overlay. Similarly, Processor 340 can subtract the reference spectrum from the higher diffraction order patterns (spectra) 352 to obtain higher order diffraction patterns which are normalized against variation in the source spectrum. These higher diffraction order patterns 352 can be compared in intensity asymmetry measurements to calculate a measurement of property of the target, for example overlay or focus.

In practice, radiation from source 330 may be provided in a series of short pulses and signals SR and ST may be captured together for each pulse. Difference signals for each individual pulse are calculated, before being aggregated into an overall reflection spectrum for this target at this angle of incidence. In this way, instability of the source spectrum between pulses is corrected for. The pulse rate may be thousands, or even tens of thousands per second (hertz). The number of pulses aggregated to measure one reflection spectrum may be tens or hundreds, for example. Even with so many pulses, the physical measurement takes a fraction of one second.

Applying this EUV spectroscopic reflectometry to metrology in semiconductor manufacturing, small grating metrology targets can be used. Multiple diffraction spectra are captured using detectors 350, 313 and 314, while setting the grazing angle of incidence a to various different values. Using the spectra detected by spectrum detector 313 and a mathematical model of the target structure, reconstruction calculations can be performed to arrive at measurement of CD and/or other parameters of interest. Alternatively or in addition, complementary higher diffraction orders detected by diffraction order detector 350 may be compared to determine asymmetry in the target structure, and therefore one or more related parameters of interest such as overlay, focus or dose, depending on the target properties.

In one embodiment of the scatterometer MT, the scatterometer MT is adapted to measure the overlay of two misaligned gratings or periodic structures by measuring asymmetry in the reflected spectrum and/or the detection configuration, the asymmetry being related to the extent of the overlay. A similar method may be used to measure focus on special targets which are formed with a focus dependent asymmetry. In the overlay case, the two (typically overlapping) grating structures may be applied in two different layers (not necessarily consecutive layers), and may be formed substantially at the same position on the wafer. The scatterometer may have a symmetrical detection configuration as described e.g. in co-owned patent application EP1, 628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US20160161863, incorporated herein by reference in its entirety.

Figure 7:
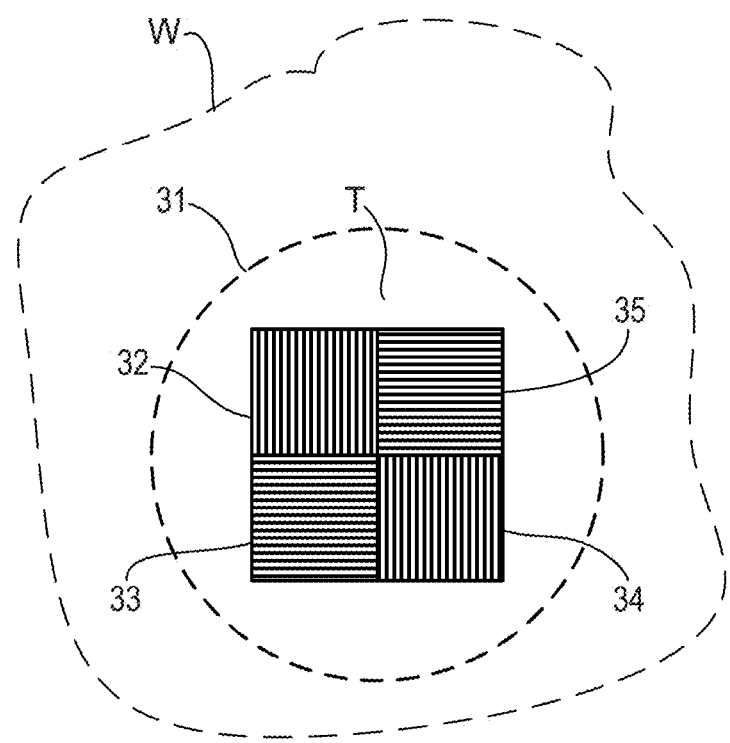
FIG. 7 depicts a known form of multiple grating target and an outline of a measurement spot on a substrate.

FIG. 7 shows an exemplary metrology target T on a substrate W, such as which may be used to measure overlay. The target T may comprise an ensemble of composite gratings or sub-targets 32, 33, 34, 35, formed by a lithographic process, mostly in resist, but also after an etch process for example. For overlay applications, the sub-targets 32, 33, 34, 35 may a pair of similar gratings (same pitch, CD, SWA, etc.) formed on the same position on the wafer in different, but not necessarily consecutive, layers. The metrology apparatus will measure the misalignment between these two overlapping gratings, known as overlay measurement. In an embodiment, the target T may be designed for dark field measurement, using a suitable scatterometer. A dark field target will typically be made smaller than the available illumination spot 31 (typical target is 5×5 microns squared whereas an illumination spot has a diameter of 35 micrometers). As such there will be sufficient space to use multiple overlay sub-targets 32, 33, 34, 35 which can be measured at the same time, allowing measurements of multiple functionalities. Sub-targets 32, 33, 34, 35, may differ in their orientation, as shown, so as to diffract incoming radiation in X and Y directions. In the specific example illustrated, sub-targets 32 and 34 are X-direction sub-targets with biases of +d, −d, respectively, and sub-targets 33 and 35 are Y-direction sub-targets with offsets+d and −d respectively. Alternatively, measurement in only one direction would require only half the sub-targets, i.e., only those corresponding to that direction. While four sub-targets are illustrated, another embodiment may include a larger matrix to obtain desired accuracy. For example, a 3×3 array of nine composite sub-targets may have biases −4d, −3d, −2d, −d, 0, +d, +2d, +3d, +4d. Separate images of these sub-targets can be identified in the image captured by detection system.

In an embodiment, asymmetry of the target, and hence, e.g., overlay, can then be determined. This may be done using an image processor and a controller by comparing the intensity values obtained for +1 and −1 orders (or other complementary higher orders) for each periodic structure 32-35 to identify any difference in their intensity, i.e., an intensity asymmetry. The term "difference" is not intended to refer only to subtraction. Differences may be calculated in ratio form or in sum form. The measured intensity asymmetries for a number of periodic structures are used together with, if applicable, knowledge of the overlay biases of those periodic structures to calculate one or more performance parameters of the lithographic process in the vicinity of the target T. A performance parameter of interest is overlay. Other parameters of performance of the lithographic process can be calculated such as focus and/or dose. The one or more performance parameters can be fed back for improvement of the lithographic process, used to improve the measurement and calculation process of the scatterometer itself and used to improve the design of the target T, for example.

More specifically, using for example the method described in PCT patent application publication no. WO 2011/012624 or US patent application US20160161863, incorporated herein by reference in its entirety, overlay between the two layers containing the sub-targets 32 to 35 may be measured by a method comprising the following steps. In an initial step, the substrate, for example a semiconductor wafer, is processed through the lithographic cell of FIG. 2 one or more times, to create a structure including the target comprising periodic structures 32-35. In a next step, a first diffraction pattern from the periodic structures 32 to 35 is obtained using one of the first order diffracted beams (say −1). In an embodiment, a first illumination mode is used. Then, whether by, for example, changing the illumination mode, or changing the imaging mode, or by rotating substrate W by 180° in the field of view of the metrology apparatus, a second diffraction pattern from the periodic structures using the other first order diffracted beam +1 is obtained. Consequently, the +1 diffracted radiation is captured in the second image. In an embodiment, the illuminated mode is changed and a second illumination mode is used. In an embodiment, tool-induced artifacts like TIS (Tool Induced Shift) can be removed by doing the measurement at 0° and 180° substrate orientation. The first and second diffraction patterns are then compared, e.g., by calculating the differences of intensity levels within diffraction patterns of each sub-target.

Figure 8:
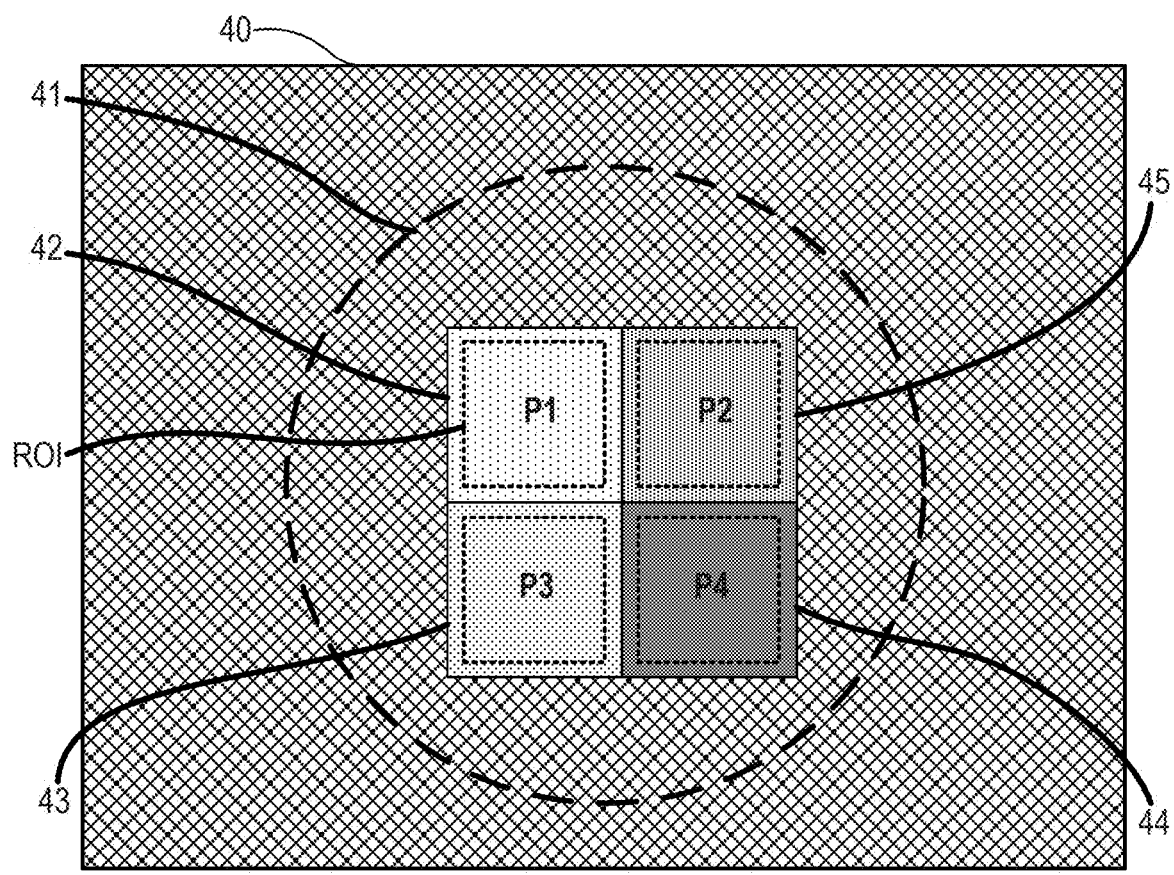
FIG. 8 depicts an image of the target of FIG. 7 obtained by a metrology method such as that disclosed herein.

FIG. 8 shows an example of an image that may be formed on and detected by a sensor, using the target of FIG. 7 as part of the method described above (e.g., using the apparatus of FIG. 6). The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Embodiments of the invention, which will be discussed hereinafter, may be implemented in one of the above discussed metrology or inspection apparatuses. Embodiments of the invention relate to methods and/or a metrology or inspection apparatus for determining a characteristic of interest of at least one structure (e.g., a target) on a substrate.

In present metrology apparatuses, a spatially incoherent light source is typically used. To increase the photon flux (in order to reduce the measurement time), it would be desirable to use an (at least partially) coherent light source, such as white light laser, with an AOTF (Acousto-Optical Tunable Filter) to select the measurement wavelength(s) and/or bandwidth(s). A coherent illumination source might also allow for a small illumination spot, which is also beneficial (e.g., in order to support smaller target sizes or to prevent illumination of structures neighboring the target). In addition, typically, in present metrology apparatuses, the supported wavelength range is limited to approximately 400 nm to 900 nm.

In general, the measurement of a suitably high quality intensity image of requires that the optics should have low aberration specifications over a wide wavelength λ range, such that there is flexibility to choose an optimal measurement wavelength and/or bandwidth. A wide wavelength range will enable measurements which cover a large number of different materials, stacks and applications. At the same time, the optics should also have a large numerical aperture NA (e.g., NA>0.8) to minimize crosstalk between neighboring structures and a large field of view. Other considerations are a large dynamic range (low ghosting/reflections) and compatibility with the dark field measurement principle which suppresses the zeroth order.

It is very difficult or impossible to implement all of these requirements and desirable features in a single metrology apparatus, as many of them will impose competing requirements on the sensor optics to maintain sufficiently low aberration performance. In particular, increasing the wavelength range of the illumination radiation significantly beyond the present 400 nm to 900 nm, while meeting the other requirements, will worsen the aberration performance of the sensor optics. This will result in increased aberrations, which in turn will worsen the detector intensity image quality.

In particular, it is desirable to facilitate a larger wavelength range, for example 200 nm to 2000 nm), in combination with a large field of view (>50 μm). Rather than attempt to achieve this optically while maintaining aberration performance, it is proposed that this be achieved by allowing the sensor optics to have greater aberrations. Of course, simply allowing larger aberrations within the sensor optics will have an unacceptable impact on the image quality unless something is done to compensate for the effect of these optical aberrations. Therefore, it is proposed to use computational imaging techniques to compensate for the negative effect of relaxation on aberration performance within the sensor optics.

As such, it is proposed to use computational imaging in a metrology apparatus for measuring a structure on a substrate formed using a lithographic process.

It is to be noted that instead of metrology apparatus one may also read metrology system. For example, it is not necessary that the measurements and the image processing are executed in the same apparatus. A separate image processing apparatus may be coupled to a metrology apparatus to form a metrology system. It is also to be noted that instead of metrology apparatus or metrology system one may read inspection apparatus or inspection system. E.g. the inspection apparatus that comprises an embodiment of the invention may be used to detect defects of a substrate or defects of structures on a substrate. In such an embodiment, a characteristic of the structure on the substrate may relate to defects in the structure, the absence of a specific part of the structure, or the presence of an unwanted structure on the substrate.

Also proposed, in an optional embodiment, is a metrology apparatus comprising an optical sensor layout in which separate optics for the illumination and detection branch, in order to reduce ghosting, stray light and/or reflection.

More specifically, it is proposed that a direct measurement of a target detector intensity image (i.e., an image of the illuminated target comprising the amplitude/intensity of the electric field at the detector) is replaced by a phase retrieval, based on a (e.g., relatively lower quality) intensity measurement, which describes the interaction of target and illumination radiation in terms of electric field amplitude and phase. This description may comprise a representation of the electric and/or magnetic field at, for example, a plane immediately above the target. In such an embodiment, the illuminated target electric and/or magnetic field image is modelled as an equivalent source description by means of infinitesimal electric and/or magnetic current dipoles on a (e.g., two-dimensional) surface in a plane parallel with the target. Such a plane may, for example be a plane immediately above the target, e.g., a plane which is in focus according to the Rayleigh criterion. It should be noted that present metrology apparatuses detect an intensity image at a conjugate plane with the plane immediately above or within the target. However the location of the model plane is not critical: once amplitude and phase at one plane are known, they can be propagated forward or backward in time to any other plane (e.g. in focus, out of focus, or even the pupil plane). The plane chosen may be located before the (e.g. non-ideal, aberrating) optics such that, in the reimaging step which follows the phase retrieval algorithm, the target can be computationally reimaged under preferred circumstances (e.g., assuming ideal sensor optics, and/or (almost) infinite numerical aperture, and/or specific (partial) coherence, and/or optimized pupil (complex) transfer mask/function). Alternatively, the description may comprise a complex transmission of the target or a two-dimensional equivalent thereof.

Typically the measured targets have unity permeability and non-unity permittivity. Hence, in an embodiment it is proposed to make use of only electric current dipoles, and not of magnetic dipoles, to represent the combination of the target and the illumination.

The proposed phase retrieval may be used to obtain additional target information, e.g., not only intensity/amplitude but also phase information and/or an extended wavelength range. Also, the proposed phase retrieval may be used to obtain better quality target information which can be used, for example, to compute overlay or focus (e.g., using existing overlay or focus algorithms). The better quality target information may relate to intensity/amplitude only, or to both intensity/amplitude and phase. By way of example, this better quality target information may result from correcting for aberrations in the sensor optics in the phase retrieval algorithm, and/or from exploiting prior knowledge of the target in the phase retrieval algorithm.

A (candidate) phase retrieval algorithm has been designed that can be combined with any optical sensor layout, as it only requires the evaluation of the forward optical model and the computation of the derivative thereof. More details of the design of this phase retrieval algorithm will be subsequently described.

Alternatively, or in combination with a prior knowledge approach, diverse measurements may be made. To achieve diversity, the imaging system may be (slightly) altered between the measurements. An example of a diversity measurement is through-focus stepping, i.e., by obtaining measurements at different focus positions. Alternative methods for introducing diversity include, for example, using different illumination wavelengths or a different wavelength range, modulating the illumination, or changing the angle of incidence of the illumination on the target between measurements.

In an embodiment, the methods described herein, e.g., more specifically the phase retrieval by performance of a suitable algorithm and the determination of a characteristic of interest, may be performed on a processor forming part of a metrology apparatus. As such, the existing imaging detection optics of a metrology apparatus may be replaced with new/other detection optics, a phase retrieval algorithm, and optionally a computational reimaging of the reconstructed electric field (both amplitude and phase) to a detector intensity and/or phase image.

Figure 9:
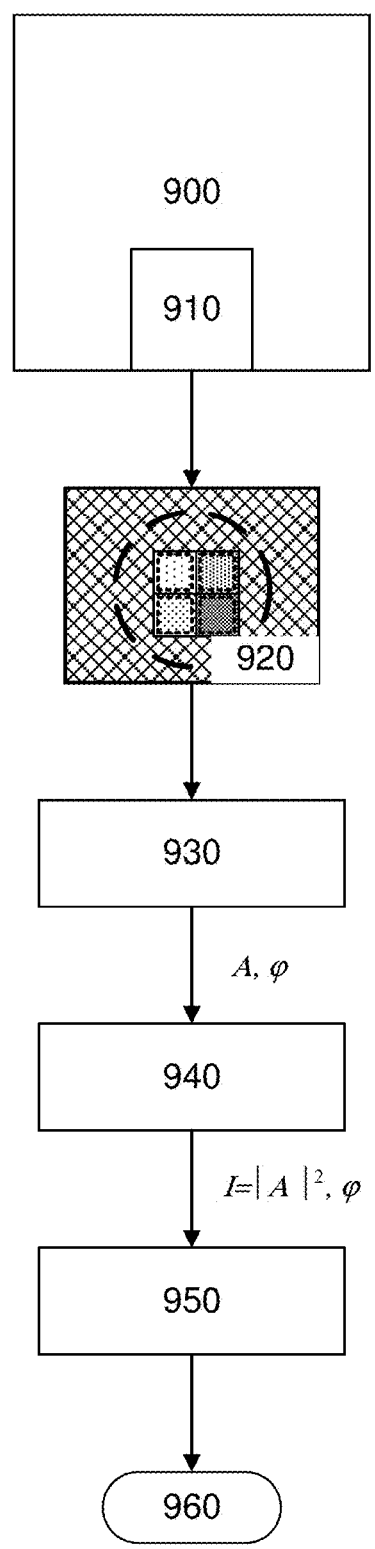
FIG. 9 schematically depicts a metrology method according to an embodiment of the invention.

FIG. 9 is a flowchart conceptually describing a method as disclosed herein. FIG. 9 shows a metrology apparatus 900 comprising a sensor optics and detector 910. As already described, the sensor optics may have increased capabilities (e.g., large wavelength range/field-of-view/NA) at the expense of aberration performance. During a measurement acquisition, an image 920 (e.g., of a target) is captured on detector 910. However, this image 920 will be of insufficient quality due to the aberrations in the sensor optics. A phase retrieval algorithm 930 is used to determine amplitude A and phase φ of the electric field at a plane parallel with the target (e.g., immediately above the target). Using a forward model of an ideal sensor (e.g., aberrations and coherence), the target is reimaged 940 to obtain intensity/(in addition to phase φ) of the field at the plane of detector 910. No target model is required. A suitable algorithm 950 is then used to calculate the characteristic of interest 960 in the conventional manner. For example, overlay may be calculated from intensity asymmetry (intensity differences) in normal and complementary (positive and negative) higher diffraction order pairs.

The phase retrieval algorithm can be combined with any of the following three optical sensor/detector layouts:

Measurements of a target where the detector is located in/near an image plane (also referred to as a field plane).
  This is likely to require the use of an objective lens, as without it (i.e., using free space propagation) the detector would need to be located unpractically close to the target (e.g., a target-to-detector distance smaller than 100 µm for a large field of view).
Measurements of a target where the detector is located in/near a pupil plane (also referred to as a Fourier plane). This can be implemented in two manners:
  Using a lens between the target and detector to act as detection optics.
  Using free space propagation between the target and detector (i.e., in a lensless configuration for example as illustrated in FIGS. 5 and 6), whereby the detector is located in/near the far-field.
Measurements of a target where the detector is located between an image plane and a pupil plane.

Detectors may be placed in more than one of these locations such that any combination of two or more of these layouts are possible, using multiple detectors each of which being located in a different plane.

It can be shown that locating the detector in either an image plane or in a pupil plane will result in a comparable photon shot noise performance on the measured target quadrant intensities for high numerical aperture cases, when making use of a phase retrieval approach as described herein.

An advantage of locating the detector(s) in/near an image plane and/or pupil plane and/or in between an image plane and a pupil plane is that multiple target defocus (i.e., multiple focus settings) can be used to obtain more information of the same target (diversity measurements). This is (in principle) not possible when the detector is located in/near the far field (i.e., when only free space propagation is used in between the target and detector).

To obtain diversity measurements at different focus settings (through-focus measurements), it is clear that the distance between sample (target) and sensor can be varied between image captures. This can be achieved by displacing the sample. However, this approach results in a large computational load as the light is digitally propagated through the whole optical system to retrieve the full electric field at the sample plane. To reduce the computational load, it is possible to displace the sensor rather than the sample. In this manner, to retrieve the field at the detector plane, only free-space propagation between the measurement planes is necessary. This phase retrieval can be done, for example, by an iterative Fresnel-propagation based algorithm, or by transport of intensity equations (TIE). This detector plane field is now required to be digitally propagated only once through the setup to retrieve the light field at the object plane.

However, the required displacement of the sensor compared to the displacement of the target is much longer. This scales with the square of the magnification of the optical system. This poses a clear speed limitation: the sensor has to be translated over a long distance. To address this, a further through-focus measurement setup is proposed which enables through focus measurements without mechanical displacement of the sample or sensor. In this setup, the focal length of the imaging system is tuned by electrical means. In this manner, the distance between the final optical element and the image plane is fixed. A possible implementation uses an electrical tunable lens (ETL), which is located on the low-NA side of the imaging system. Such ETLs have a fast tuning response enabling fast through-focus measurements. ETLs are commercially available and, in addition to fast tuning, also have a high transmission bandwith, low distortion and low costs.

For the lensless example, an advantage of locating the detector in/near the pupil plane is that, provided the distance between the target and detector is large enough (e.g., ≥50 mm), the aberrations of the detection optics can either be neglected, or if this distance is smaller (e.g., <50 mm), the aberrations are very well known and do not need to be calibrated.

A detection optics aberration calibration could, for example, be based upon measuring the same identical target for multiple different angles of rotation (Rz) and/or position shifts (in the x- and y-direction). A similar approach can also be used to calibrate/characterize the illumination spot amplitude, phase and/or coherence distribution (e.g., illumination speckle).

The target may be illuminated using spatially incoherent illumination radiation (e.g., from a spatially incoherent source), using spatially coherent illumination radiation (e.g., from a spatially coherent source) or using spatially partially coherent illumination radiation (e.g., from a spatially partially coherent source). In the latter case using partially coherent illumination radiation, and where the detector is in/near an image plane, the effects thereof can be modelled by means of a Sum of Coherent Systems approach. Should the detector be located in/near a pupil plane, Schell's theorem could provide an alternative modelling approach which is computationally less demanding than for the Sum of Coherent Systems approach.

It is typically desirable to maximize the ratio of wavelength to target pitch (hereafter referred to as the $\lambda/p$ ratio). However, as the numerical aperture (NA) of the optics is increased, there is a corresponding increased likelihood of capturing orders higher than the first diffraction orders (e.g., a second diffraction order). In current scatterometry systems, this will typically ruin the captured image. The proposed methods described herein provide additional opportunities for eliminating the impact of the second order diffraction using computational techniques.

A first proposal for minimizing the effects of second order diffraction comprises using multiple low-NA lens and detector pairs, for example adjacent to each other, such that no two diffraction orders are captured by the same detector. This can be implemented practically via computational imaging systems such as described herein, as the proposed optics for such systems are relatively simple (e.g. detection optics comprising one double aspherical lens between target and detector).

A further proposal for minimizing the effects of second order diffraction comprises making use of a phase retrieval algorithm as described herein. Instead of retrieving only one amplitude and phase image of the target in the manner described, it is proposed to simultaneously retrieve multiple images of the target, i.e., one image per diffraction order. More specifically, it is proposed to simultaneously retrieve one amplitude and phase image per diffraction order which can propagate to the sensor. This approach is applicable to the full vectorial case in addition to the scalar case.

As will be described in further detail below (in the section headed "Example phase retrieval algorithm"), a total variation inspired regularization (i.e., prior knowledge) can be applied to amplitude and phase images corresponding to multiple illumination wavelengths and/or illumination polarizations. It is proposed that such regularization can also be applied to the amplitude and phase images resultant from multiple diffraction orders propagating to the sensor. It should be noted that propagating one phase and amplitude image per diffraction order is equivalent to obtaining the electromagnetic light field radiated by the sample and a geometrical parameterization of the target, such that the field is subsequently divided into the diffraction orders by (for example) a Fourier decomposition or the optical propagation itself.

It will be appreciated that the electromagnetic light field (intensity and phase) can also be obtained using a holographic setup.

Whether measured holographically or using computational phase retrieval, the target can be computationally re-imaged to introduce an arbitrary (e.g., chosen/optimized) pupil filtering/masking. In this way it is possible to retrieve a (computationally) re-imaged sensed image of the target which comprises a chosen/optimized combination of diffraction order information originating from the (retrieved) target.

Extending this further, it is possible to use the phase retrieval algorithm to obtain information regarding the zeroth order and higher diffraction orders. This can be done by either a) starting from a higher resolution image and performing suitable Fourier transformations (Fourier decomposition) and hence filter on the higher resolution image; or b) starting from separate images for each of the relevant diffraction orders and applying additional regularizations and/or constraints for the phase retrieval algorithm as described (e.g., image similarity in different diffraction orders).

In an embodiment, any of the methods described herein may comprise computationally re-imaging the target electric field (for example, the electric and/or magnetic electric field at target level, comprising a complex target image) under different conditions, for example, for different detection optics, aperture mask conditions and/or illumination conditions. This applies whether the complex target image is measured using e.g., computational phase retrieval or measured directly using holography.

A computationally optimized illumination condition may comprise computationally re-imaging with full incoherent illumination, for example. This typically results in a smoother image with less ringing artifacts. This can be considered to be a form of coherence filtering which is likely beneficial to reduce the ringing effects present in the detector intensity images, which can otherwise impact the measured average intensities.

Such computational re-imaging techniques may also be used to apply apodization digitally. Presently, apodization may be applied by means of a physical apodizer in (or near)

a pupil plane of the imaging system for the purpose of reducing crosstalk between structures being measured by engineering the (complex) point spread function of the imaging system. Such physical apodizers discard light and results in additional reflections and losses in the beam path. A digital apodization algorithm also has the advantage that it allows for dynamic tuning of the apodization, such that it can be adjusted for specific target/wafer/device structure combinations.

Additionally, the digital propagation and/or tuning of illumination conditions might include optimization of:

- the (digital) illumination coherence; assuming that the electric fields at target level have full spatial coherence, partial spatial coherence or are spatially incoherent. This can be achieved, for example, by introducing an illuminator in the re-imaging model. Alternatively it is possible to alter the spatial coherence of the target directly (e.g. assume that points in the target beyond a certain distance are mutually incoherent for example). This is possible as the field at target level is computationally retrieved, so in that sense there does not need to be an explicit illuminator in the model when retrieving the target.
- (digital) illumination masking; i.e., blocking some regions of the target illumination;
- (digital) illumination spectrum shape;
- (digital) illumination polarization; this requires separate measurements for at least two different illumination polarizations to be performed, or alternatively a very good model of the illumination and target to be present;
- (digital) polarizers in the (digital) optics to suppress the above mentioned cross talk effects in the case of a full-vectorial implementation (where there is access to the polarization components of the electric field);
- choose/optimize combinations of diffraction orders (as already described); e.g., by optimizing pupil filtering/masking to retrieve a derived (re-imaged) sensed image of the target which comprises a chosen/optimized combination of diffraction order information originating from the (retrieved) target;
- optimize or change one or more conditions in the optical path from the target to the sensor. Essentially, anything that can be physically changed in an imaging system, can be digitally changed in a digital model thereof; this may comprise for example: changing optical details of the detection optics, e.g., changing the NA of the detection optics, changing any other lenses/optical components (e.g., changing focal distance and/or introducing/altering/removing aberrations), (digitally) introducing a filter in detection branch;
- choose/optimize different focus settings, e.g., re-imaging at different focus values than the focus corresponding to the actual measurement. Re-imaging to focus on different layers in an image (e.g., obtained at a single focus setting).

It is also possible to average multiple images (i.e. average multiple images computed by means of re-imaging as described above). In the remainder of this section, the computationally re-imaged images are described as "re-images" for brevity. Such averaging may be useful, for example, when measuring thick stacks, where the distance in between the top and bottom grating of an overlay target might be large (e.g., with respect to the depth of focus). In that case at least one of the edges of the two gratings (i.e. top and bottom grating) is always blurry. This leads to process variations impacting the overlay performance. To address this, it is proposed, for example, to compute a re-image that is at best focus for the top grating and another re-image that is at best focus for the bottom grating. These two re-images can then be averaged and overlay inferred (using asymmetry intensity for example) from the averaged re-image, as the averaged re-image may be more process robust.

A further generalization of such averaging may comprise applying a technique similar to optical color weighting (OCW), typically used in wafer alignment (OCW is described, for example, in Menchtchikov et al. "*Reduction in overlay error from mark asymmetry using simulation, ORION, and alignment models*" Proceedings of the SPIE, Volume 10587, id. 105870C 10 pp. (2018); incorporated herein by reference). In such a proposal, two or more re-images are computed and combined using a weighting. The weighting is such that the sum of weights equals one, but individual weights may be negative. Therefore the re-images are summed according to the weight attributed to each re-image, with the sum of the weights equaling one, to obtain a single weighted re-image. This makes it possible to train the weights, such that the measurement becomes less sensitive to process variations.

The weighting/averaging can be performed over the following dimensions:

Focus (as per the example above).
Wavelength.
Polarization.
Spatial coherence.
Pupil apodization/masking.
Diffraction order of target.

An advantage of weighting intensity re-images over weighting multiple overlay estimates (i.e., one overlay estimate for each individual re-image), the latter example being most similar to what is done in OCW for wafer alignment, is that it is possible to visually inspect/optimize for favorable features in the averaged re-image. This is an advantage as no (external) absolute overlay reference is likely to be available for training to. An example of a favorable feature may be a minimal intensity ripple inside the overlay target region of interest.

Example Phase Retrieval Algorithm

Loss Function

In an embodiment, it is proposed that prior (target) knowledge is included in a loss function that forms the starting point to derive/design the phase retrieval algorithm. In such an embodiment, the prior knowledge may be based on certain observations; for example there is much regularity between each image of the multiple images of the target. The multiple images may be obtained in a single measurement (e.g., a measurement using more than one illumination condition. e.g., a multi-wavelength measurement) or from diversity measurements (different focus levels etc.) already described. In this context, measuring under different illumination conditions may comprise the use of illumination radiation where one or more of wavelength and/or polarization and/or temporal and/or spatial coherence of the illumination radiation is varied between measurements. It can be observed that, regardless of the illumination condition/focus setting, each image comprises a flat structure, essentially having the form of FIG. 8 (assuming a target of the form of FIG. 7). As such, each image can be observed to have the same or very similar position and shape for each region of interest (e.g., 4 rectangular or square shaped ROIs, one in each quarter of a larger square or rectangular shaped target region), and where each region of interest comprises a region of relatively high intensity having a relatively flat intensity profile. It is proposed that this similarity between images be exploited, in an embodiment, by means of a generalization of a Total Variation or Vector Total Variation regularization (i.e., imposing an L1 penalty on the gradient of the target image). A benefit of this Vector generalization is that it introduces a coupling between different illumination conditions (this coupling hereafter referred to as wavelength coupling, although it is more generally applicable to coupling of measurements corresponding to variation of other illumination conditions). This wavelength coupling may be similar to the coupling which results from the introduction of dispersion models (also known as n&k models as they describe the relationship of refractive index n and/or extinction coefficient k through wavelength), but without the need for layer thicknesses, layer complex permittivity information or geometrical parameterization of the target to be specified, for example.

It should be clear that diversity, prior target knowledge or both may be used in the phase retrieval. With sufficient diversity, it should not be necessary to impose a constraint and/or regularization based on prior target knowledge to ensure convergence. Equally, by constraining and/or regularizing the phase retrieval algorithm using prior target knowledge, diversity (e.g., measurement at different levels of defocus) should not be necessary. Greater accuracy or better guarantee of convergence may be obtained by using both diversity and imposing a prior target knowledge constraint and/or regularization.

The wavelength coupling resultant from the use of prior knowledge (e.g., as a constraint, regularization or hybrid regularization and constraint) also can be used to suppress of coherent imaging artifacts such as image speckle. In normal imaging systems, a well-known way to suppress speckle is to increase the bandwidth. It is proposed herein to perform the phase reconstruction for multiple wavelengths/illumination conditions simultaneously. The resultant wavelength coupling introduces a form of averaging (which is what the proposed prior knowledge regularization does). This leads to a computational equivalent to speckle reduction in a normal imaging system by increasing the bandwidth.

Performing the phase reconstruction for multiple wavelengths/illumination conditions also enables identification and removal of coherent imaging artifacts which may result, in particular, from the proposed use of spatially coherent light. Such coherent imaging artifacts may comprise interaction between neighboring targets, such as ringing artifacts and speckle (speckle is being classed as a coherent imaging artifact for the purposes of this disclosure; it is a related effect, although originating from path length variations such as from surface roughness). Optics-induced ringing artifacts should be distinguished from true processing effects which happen to resemble such ringing artifacts in an image. It can be observed that optics-induced ringing artifacts show a strong variation through wavelength, while true processing effects do not. As such, the strong wavelength dependency can be used in the image recovery algorithm to remove much of the effects of optics-induced ringing artifacts and speckles without suppressing true processing effects, as the ringing-like effects resultant from true processing effects have a spatial frequency that is wavelength-independent. One way of achieving this is by using the proposed vector generalization of a Total Variation or Vector Total Variation regularization. The wavelengths can be chosen in a recipe creation setup, based on optimizing a range of KPIs such as sensitivity, stack sensitivity, process robustness and grating imbalance, for example.

In phase retrieval there are in essence two possible algorithmic approaches at the highest level. The first of these approaches is a "feasibility problem" or projection onto convex and/or non-convex sets approach (e.g. the Gerchberg-Saxton algorithm) and the second approach is an optimization problem approach. As the proposed forward optical model (see below) has no closed form inverse operator, the gradient of the non-linear forward optical model is used to implement the reverse mapping. Such a gradient based minimization method may comprise, for example, a gradient descent, Newton method, Gauss-Newton method or quasi-Newton method. Hence the optimization approach is more appropriate, as a feasibility or projection based approach will ultimately amount to an optimization problem when making use of the gradient of the non-linear forward optical model to implement the reverse mapping. It should also be appreciated that multiple detector intensity measurements will be used in the proposed phase retrieval algorithm.

It is proposed that the phase retrieval loss function has a data fidelity term and a prior information term (i.e., regularization term). Optionally the prior information may be used to apply one or more constraints to the phase retrieval minimization of the loss function. In an embodiment, the data fidelity term comprises a least squares sum (i.e. an L2 norm) of the difference between the modeled intensities and the measured intensities. An L2 norm is proposed because the noise of the measured intensities will have a near to Gaussian distribution, and a least squares minimization will result in a minimum variance unbiased estimator. Additionally, a least squares minimization might lead to possibility, in future, to make use of a Gauss-Newton approximation of the resulting Newton equation (depending on the properties of the regularization term in the phase retrieval loss function).

For the prior information term (i.e., regularization term) of the phase retrieval loss function, it is proposed to use an L1 norm, and more specifically a total variation norm. The total variation norm is related to the contour length of the level set that represents the (unknown) target (phase and amplitude). As the unknown target consists of three separate polarization directions, and its measurement possibly also relates to more than one illumination condition, in an embodiment, a vector extension of the total variation norm will be used. In the specific case described herein, the unknown target is a complex function (i.e., not only intensity but both amplitude and phase), which implies that an additional extension of the vector total variation norm may be suitable. The additional extension proposed may be based on the fact that the dominant singular value of the Jacobian matrix equals the gradient magnitude for real vector fields. Making use of this vector extension of the total variation norm will have the added benefit that registration errors (i.e., overlay) of the resulting target amplitude and phase between illumination conditions will also be penalized. Note that the prior information term of the phase retrieval loss function will act on a local target level (i.e., pixel neighborhood), which is beneficial from an algorithm parallelization point of view.

In an embodiment, the phase retrieval loss function L may take the form:

$$L = F_D + G_T \qquad (1)$$

The fidelity term $F_D$, in a specific embodiment may take the form $$F_D = \frac{1}{2}\|\underline{R}_D\|_2^2 \quad (2)$$

$$\underline{R}_D = \begin{bmatrix} \underline{I}_{D,model}(1) \\ \underline{I}_{D,model}(2) \\ \vdots \\ \underline{I}_{D,model}(W) \end{bmatrix} - \begin{bmatrix} \underline{I}_{D,meas}(1) \\ \underline{I}_{D,meas}(2) \\ \vdots \\ \underline{I}_{D,meas}(W) \end{bmatrix} \quad (3)$$

$$\underline{I}_{D,model}(w) = \sum_{p \in \{x,y,z\}} \begin{bmatrix} I_{D,model}(J_{T,p}(\lambda_w), x_{w,1}, y_{w,1}, z_{w,1}, \lambda_w) \\ I_{D,model}(J_{T,p}(\lambda_w), x_{w,2}, y_{w,2}, z_{w,2}, \lambda_w) \\ \vdots \\ I_{D,model}(J_{T,p}(\lambda_w), x_{w,S(w)}, y_{w,S(w)}, z_{w,S(w)}, \lambda_w) \end{bmatrix} \quad (4)$$

$$\underline{I}_{D,meas}(w) = \begin{bmatrix} I_{D,meas}(x_{w,1}, y_{w,1}, z_{w,1}, \lambda_w) \\ I_{D,meas}(x_{w,2}, y_{w,2}, z_{w,2}, \lambda_w) \\ \vdots \\ I_{D,meas}(x_{w,S(w)}, y_{w,S(w)}, z_{w,S(w)}, \lambda_w) \end{bmatrix} \quad (5)$$

The prior information term or regulation term in a specific embodiment may take the form:

$$G_T = \mu \sum_{u=1}^{U} g_T(u) \quad (6)$$

$$g_T(u) = \sigma_1([\partial_x \underline{\Gamma}_T(x_u, y_u) \partial_y \underline{\Gamma}_T(x_u, y_u)]) \quad (7)$$

$$\underline{\Gamma}_T(x_u, y_u) = \begin{bmatrix} \underline{J}_T(x_u, y_u, \lambda_1) \\ \underline{J}_T(x_u, y_u, \lambda_2) \\ \vdots \\ \underline{J}_T(x_u, y_u, \lambda_W) \end{bmatrix} \quad (8)$$

$$\underline{J}_T(x_u, y_u, \lambda_w) = \begin{bmatrix} J_{T,x}(x_u, y_u, \lambda_w) \\ J_{T,y}(x_u, y_u, \lambda_w) \\ \vdots \\ J_{T,z}(x_u, y_u, \lambda_w) \end{bmatrix} \quad (9)$$

Where:
W denotes the total number of measured wavelengths;
S(w) denotes the total number of detector intensity sample positions for wavelength identifier $w \in \{1, 2, \ldots, W\}$;
U denotes the total number of regularization target dipole electric current sample positions;
$\lambda_w$ denotes the measurement wavelength (or more generally, illumination condition) for wavelength identifier $w \in \{1, 2, \ldots, W\}$;
$J_{T,p}$ denotes the target dipoles electric current distribution, for the three polarization directions $p \in \{x, y, z\}$;
μ denotes the regularization multiplier, the value (≥0) of which is to be chosen based on an appropriate level of regularization;
$\sigma_1(\underline{X})$ denotes the largest singular value of matrix $\underline{X}$;
$\partial_x$ and $\partial_y$ denote the partial derivative operator, in the target x-direction respectively the target y-direction;
$(x_{w,s}, y_{w,s}, z_{w,s})$ for $w \in \{1, \ldots, W\}$ and $s \in \{1, \ldots, S(w)\}$ denote the intensity sample positions; and
$(x_u, y_u, \lambda_w)$ for $u \in \{1, \ldots, U\}$ denote the target dipole electric current sample positions.

It should be noted that Equation (7) above gives only one embodiment of the Vector Total Variation norm. Another embodiment may comprise a nuclear norm, i.e. $g_T(u) = \|[\partial_x \underline{\Gamma}_T(x_w, y_u) \partial_y \underline{\delta}_T(x_w, y_u)]\|$. In general any suitable scalar function of the singular values and/or eigenvalues of the matrix within the square brackets may be used.

It should also be noted that the most dominant singular value of a real Jacobian matrix (i.e., $g_T(u)$ if it were a real matrix) equals the non-negative gradient magnitude. Furthermore, in the implementation of the phase retrieval algorithm on a processor, it may be assumed that the target is periodic and discrete, thus enabling use of the fast Fourier transform (FFT) to compute the Fourier transforms in the numerical evaluation of the forward optical model optical, and the use of a cyclic difference matrix $\underline{L}$ to compute the derivatives $\partial_x$ and $\partial_y$ of Equation (7).

Equations (4), (5), (6) and (7) will now be redefined into their periodic and discrete form as described by Equations (11), (12) and (13) below. These are a more practical form, which can be more efficiently solved and therefore are the form proposed to be used herein, according to an embodiment:

$$\underline{\check{\Gamma}}_T = \operatorname*{argmin}_{\underline{\Gamma}_T}(L) \quad (10)$$

$$\underline{I}_{D,model}(w) = \sum_{p \in \{x,y,z\}} \begin{bmatrix} I_{D,model}\left((\underline{\Gamma}_T)_{(:,\{n,n+1,n+2\})}, x_{w,1}, y_{w,1}, z_w, \lambda_w\right) \\ I_{D,model}\left((\underline{\Gamma}_T)_{(:,\{n,n+1,n+2\})}, x_{w,2}, y_{w,2}, z_w, \lambda_w\right) \\ \vdots \\ I_{D,model}\left((\underline{\Gamma}_T)_{(:,\{n,n+1,n+2\})}, x_{w,S(w)}, y_{w,S(w)}, z_w, \lambda_w\right) \end{bmatrix} \quad (11)$$

$$\underline{I}_{D,meas}(w) = \begin{bmatrix} I_{D,meas}(x_{w,1}, y_{w,1}, z_w, \lambda_w) \\ I_{D,meas}(x_{w,2}, y_{w,2}, z_w, \lambda_w) \\ \vdots \\ I_{D,meas}(x_{w,S(w)}, y_{w,S(w)}, z_w, \lambda_w) \end{bmatrix} \quad (12)$$

$$G_T\left(\underline{L} \cdot \underline{\Gamma}_T\right) = \sum_{m=1}^{UV} \sigma_1\left(\left(\underline{L} \cdot \underline{\Gamma}_T\right)_{(m, m+UV\},:)}\right) \quad (13)$$

$$\underline{L} = \mu \begin{bmatrix} \underline{D}_x \\ \underline{D}_y \end{bmatrix} \quad (14)$$

$$\underline{\Gamma}_T = \mu \begin{bmatrix} \underline{\Gamma}_T^T(x_1, y_1) \\ \underline{\Gamma}_T^T(x_2, y_1) \\ \vdots \\ \underline{\Gamma}_T^T(x_U, y_1) \\ \underline{\Gamma}_T^T(x_1, y_2) \\ \vdots \\ \underline{\Gamma}_T^T(x_U, y_V) \end{bmatrix} \quad (15)$$

where:
$\underline{\check{\Gamma}}_T$ denotes the retrieved phase and amplitude of the target;

$$n = 3w - 2;$$

U now denotes the total number of regularization target dipole electric current Cartesian sample positions in the x direction;
V notes the total number of regularization target dipole electric current Cartesian sample positions in the y direction;
$(x_{w,s}, y_{w,s}, z_w)$ for $w \in \{1, \ldots, W\}$ and $s \in \{1, \ldots, S(w)\}$ denote (a subset of) the detector intensity Cartesian sample positions such that it is possible to select all said Cartesian sample positions or a subset thereof;

$(\underline{X})_{(:,n)}$ extracts column n of matrix $\underline{X}$;
$(\underline{X})_{(m,:)}$ extracts row m of matrix $\underline{X}$;
$x^T$ denotes the transpose of vector $\underline{x}$; and
$\underline{D}_x$ and $\underline{D}_y$ denote the cyclic difference matrices which, for each row, have a −1 at the diagonal entry and 1 at the appropriate off-diagonal entry, all other elements being zero;

Example Optimization Algorithms

The phase retrieval loss function as described by Equation (1) is a convex function without continuous derivatives due to the L1 regularization term. A simplified example of this is provided by the equation: $|x|=\sigma_1([x\ 0])$. Hence it is not advantageous to make use of a gradient based optimization algorithm to implement Equation (10). Instead it is proposed to use a proximal based optimization algorithm to implement Equation (10), as will be described in this section.

The optimization algorithm that may be used is a forward-backward based primal-dual algorithm. The term forward-backward applies to the splitting of the loss function L into a first part having a continuous first order derivative; e.g., the data fidelity term $F_D$ and a second part having a non-discontinuous first order derivative; e.g., the prior information term $G_T$. As the gradient of the prior information term $G_T$ does not exist, the gradient is replaced by the proximal operator thereof, which leads to a forward step using the gradient of the data fidelity term $F_D$ and a backward step using the proximal operator of prior information term $G_T$. The term "primal-dual" refers to the fact that the primal and dual optimization problem are simultaneously solved, which is beneficial as the proximal operator of $G_T$ is easier to compute in its dual form.

An example of an algorithm to minimize loss function L and therefore solve Equation (10) above will now be provided. This algorithm is written in pseudo code using a notation that directly interfaces with the loss function L (Equation (1)):

| | |
|---|---|
| 1. | Set $\underline{\Gamma}_1 \in \mathbb{C}^{UV \times 3W}$ |
| 2. | Set $\underline{\Omega}_1 \in \mathbb{C}^{2UV \times 3W}$ |
| 3. | Set $\tau \in ]0, +\infty[$ |
| 4. | Set $\phi \in ]0, +\infty[$ |
| 5. | $k \leftarrow 1$ |
| 6. | while not converged do |
| 7. | $\underline{s}_k \leftarrow \underline{\Gamma}_k - \tau \frac{\partial F_D}{\partial \underline{\Gamma}}(\underline{\Gamma}_k)$ |
| 8. | $\underline{v}_k \leftarrow \underline{s}_k \cdot \tau \underline{L}^T \cdot \underline{\Omega}_k$ |
| 9. | $\underline{q}_k \leftarrow \text{prox}_{\phi G^*_T}(\underline{\Omega}_k + \phi \underline{L} \cdot \underline{v}_k)$ |
| 10. | $\underline{p}_k \leftarrow \underline{s}_k - \tau \underline{L}^T \cdot \underline{q}_k$ |
| 11. | Set $\eta_k \in ]0, +\infty[$ |
| 12. | $\underline{\Gamma}_{k+1} \leftarrow \underline{\Gamma}_k + \eta_k (\underline{p}_k - \underline{\Gamma}_k)$ |
| 13. | $\underline{\Omega}_{k+1} \leftarrow \underline{\Omega}_k + \eta_k (\underline{q}_k - \underline{\Omega}_k)$ |
| 14. | $k \leftarrow k + 1$ |
| 15. | end while |
| 16. | Return $\underline{\check{\Gamma}} \leftarrow \underline{\Gamma}_{k+1}$ |
| 17. | Return $\underline{\check{\Omega}} \leftarrow \underline{\Omega}_{k+1}$ | where:
$]a, b[ = \{x \in \mathbb{R} | a < x < b\}$ $\underline{L}^T$ is the transpose of $\underline{L}$
$\text{prox}_{\phi G^*_T}(\underline{\Omega}_T)$ denotes the proximal operator of the scaled conjugate $\phi G^*_T(\underline{\Omega}_T)$; and
$G^*_T(\underline{\Omega}_T)$ denotes the conjugate of $G_T(\underline{L} \cdot \underline{\Gamma}_T)$. Note that the conjugate function is not the same as the complex conjugate. Note that the subscript $_T$ of variables $\underline{\Gamma}_T$ and $\underline{\Omega}_T$ has been omitted in the above pseudo code description for clarity.

It should be noted that other unknowns may also be introduced as variables; for example: an uncertain focus position of the target, an uncertain aberration function of the detection optics or an uncertain illumination property (e.g. illumination amplitude, phase, spatial coherence and/or temporal coherence). This will simply result in the matrix $\underline{L}$ being padded with additional zeros.

Note that an iterative modification of matrix $\underline{L}$ is allowed (i.e. matrix $\underline{L}$ becomes a function of the iteration number k), this can be exploited to further improve the estimation performance.

An advantage of this particular forward-backward based primal-dual algorithm is that it requires the computation of the simpler proximal operator $\text{prox}_{\phi G^*_T}(\underline{\Omega}_T)$ i.e., the left hand side multiplication with $\underline{L}$ is taken care of by the optimization algorithm, and does not need to be taken into account in the computation of the proximal operator itself. Another advantage is that no inverse or decomposition of matrix $\underline{L}$ needs to be computed.

It can be shown that:

$$\left(\text{prox}_{\phi G^*_T}(\underline{\Omega}_T)\right)_{(\{m, m+UV\},:)} = \quad (16)$$

$$\underset{\underline{X}}{\arg\min}\left\{\iota_{\mathcal{B}}(\underline{X}) + \frac{1}{2\phi}\left\|\underline{X} - \left(\underline{\Omega}_T\right)_{(\{m, m+UV\},:)}\right\|_F^2\right\}$$

$$\iota_{\mathcal{B}}(\underline{X}) = \begin{cases} 0 & \text{if } \underline{X} \in \mathcal{B} \\ \infty & \text{if } \underline{X} \notin \mathcal{B} \end{cases}$$

where $\mathcal{B} = \{\underline{X} | \|\underline{X}\|_* \leq 1\}$ denotes the matrix nuclear norm unit ball.

The projection of $(\text{prox}_{\phi G^*_T}(\underline{\Omega}_T))_{(\{m, m+UV\},:)}$ into the matrix nuclear norm unit ball $\mathcal{B}$ can be conveniently computed by means of a single value decomposition of $(\underline{\Omega}_T)_{(\{m, m+UV\},:)} \in \mathbb{C}^{2 \times 3W}$. A suitable method for doing this can be found, for example, in: Goldluecke, Bastian, Evgeny Strekalovskiy, and Daniel Cremers; the natural vectorial total variation which arises from geometric measure theory; SIAM Journal on Imaging Sciences 5, no. 2 (2012): 537-563; (see corollary 3.6, theorem 3.7 and FIG. 7), the entire document being herein incorporated by reference. It should be noted that, in the above example algorithm, the matrix $(\underline{\Omega}_T)_{(\{m, m+UV\},:)}$ is a complex matrix, while the equivalent matrix in the document incorporated by reference in this paragraph is a real matrix. It will be readily apparent to the skilled person how such a model may be adapted for a complex matrix.

Other Regularization Options

The above described algorithm and cost function uses a specific regularization (i.e., prior information term Gr) to incorporate prior target knowledge into the phase retrieval problem. However this is only an example of regularization and other methods to benefit from the prior (target) knowledge can be used. A number of such methods will now be described. It should be noted that any of these prior forms of regularization and/or "model order reduction" methods may be used singularly or in any combination, either as an alternative to the above described regularization or as one or more further constraints to supplement this regularization. Different regularization methods, and combinations thereof, may be better for measuring different structures (different stack and/or target properties) and in different applications.

A first possible option is to make use of a "minimum description length" (e.g., Kolmogorov complexity) based regularization. An example embodiment could compress the target electric field image by means of Liv-Zempel and/or run-length like compression schemes and use the length of the resulting compressed bit stream as the metric. The compression scheme may take advantage of the knowledge that the target structures are simple, repetitive structures, and therefore the regularization may impose a bias against solutions with a high Kolmogorov complexity, for example.

In a somewhat similar manner, a matrix/tensor rank based regularization could also be used, or an approximation of the matrix/tensor rank such as the matrix nuclear norm (i.e. the sum of singular values of a matrix or tensor). Such a matrix rank or nuclear norm regularization may impose a low-rank constraint on the solution, for example. Again this will bias against solutions which imply complex target structures.

Another option, should measurement and/or simulation data of the target be available beforehand (i.e., before performing the actual measurement), this data can be exploited to generate (for example) a search library, or to generate and exploit a projection into a lower dimensional subspace. For example, the search library may be used to reduce the number of degrees of freedom, by limiting potential solutions to only those which are a linear combination of library images of the target.

In another option, where hyperspectral illumination radiation is used (for example when measuring with 100 or more different illumination wavelength and polarization combinations), a generic dispersion model could be used to reduce the total number of degrees of freedom. Determining a generic dispersion model may comprise modeling the change in refractive index (or similar parameter) against wavelength/polarization (or propagation direction in the material) for each target using the measurement data from each wavelength and polarization combination. The model may then comprise a model of the target as a transmission function. The prior regularization function would, in such a case, operate on the input coefficients of such a dispersion model. As the retrieved phase and amplitude is wavelength/polarization dependent, the model can output an image for a wavelength and polarization combination of interest. In an embodiment, the electric permittivity function $\varepsilon_r(\omega)$ may take the form:

$$\varepsilon_r(\omega) = 1 + \chi(\omega) \quad (17)$$

$$\chi(\omega) = c_{re} - i \cdot \sum_{m=0}^{M} \frac{a_m}{i \cdot \omega - b_m} - \frac{a_m^*}{i \cdot \omega - b_m^*} \quad (18)$$

$$b_m = -\zeta_m \cdot \omega_m + \omega_m \cdot \sqrt{\zeta_m^2 - 1} \quad (19)$$

and $c_{re}$ is the real offset constant, $a_m$ is the dipole complex amplitude, $\omega_m$ dipole natural eigen-frequency, $\zeta_m$ is the dipole sampling constant ($0 < \zeta_m < 1$) and $$\frac{1}{\zeta_m \cdot \omega_m}$$

is the dipole time constant. Note that all poles occur as (conjugated) pole pairs (dipoles), where M denotes the total number of pole pairs.

Example Optics Forward Model

The optics forward model used to calculate the modelled intensities in the data fidelity term $F_D$ of Equation (1) may take the form of a vector forward model. An example coherent vector forward model will now be described. Other suitable models may also be used, for example the model may be modified so that or can handle partially spatially coherent or spatially incoherent illumination radiation, as appropriate. In the description below, the subscripts D, P and T refer to the coordinate systems of the detector, pupil and target respectively. Note that in this geometry all lenses in between the target and the detector (via the aperture stop) have been replaced by a far field free space propagation. However, in an embodiment, the model may additionally model the effect of one or more optical elements (e.g., the objective lens) on the scattered radiation to obtain the modelled characteristic of the scattered radiation.

The vector forward model may begin with the observation that the electric field on the entrance pupil is locally a plane wave and therefore only its tangential electric field E components $E_{P,\vartheta}$ and $E_{P,\varphi}$ are non-zero and the normal electric field component $E_{P,\rho}$ is zero. As electric field at the exit pupil equals the electric field at the entrance pupil, this property, also applies to the electric field at the exit pupil.

It is convenient to compute the propagation of the electric field from the exit pupil to detector in the Cartesian polarization coordinate system, as in that case the direction of the individual polarization components does not depend on the spatial location at the detector.

$$\begin{bmatrix} E_{D,x}(x,y,z) \\ E_{D,y}(x,y,z) \\ E_{D,z}(x,y,z) \end{bmatrix} = \quad (20)$$

$$\int\int_{-\infty}^{+\infty} \Omega(k_x, k_y, z) \begin{bmatrix} E_{P,x}(k_x, k_y) \\ E_{P,y}(k_x, k_y) \\ E_{P,z}(k_x, k_y) \end{bmatrix} \exp\left(-i\frac{2\pi}{\lambda}\begin{bmatrix} k_x \\ k_y \end{bmatrix}^\dagger \cdot \begin{bmatrix} x \\ y \end{bmatrix}\right) dk_x dk_y$$

$$\begin{bmatrix} k_x \\ k_y \\ k_z \end{bmatrix} = \begin{bmatrix} \cos\varphi\sin\vartheta \\ \sin\varphi\cos\vartheta \\ \cos\vartheta \end{bmatrix}$$

Where $$\Omega(k_x, k_y, z) = D(k_x, k_y, z) K(k_x, k_y) A(k_x, k_y) \quad (21)$$

$$D(k_x, k_y, z) = \exp\left(-i\frac{2\pi}{\lambda} k_z z\right) \quad (22)$$

$$A(k_x, k_y) = \begin{cases} 1 & \text{for } k_r < NA \\ 1 \text{ or } & k_r \geq NA \end{cases} \quad (23)$$

$$k_r = \sqrt{k_x^2 + k_y^2} \quad (24)$$

$$K(k_x, k_y) = \cos\vartheta = k_z = \sqrt{1 - k_x^2 - k_y^2} \quad (25)$$

The detector intensity for the full coherent case $I_{D,coh}$ (x, y, z) can be calculated by:

$$I_{D,coh}(x,y,z) = \begin{bmatrix} E_{D,x}(x,y,z) \\ E_{D,y}(x,y,z) \\ E_{D,z}(x,y,z) \end{bmatrix}^\dagger \cdot \begin{bmatrix} E_{D,x}(x,y,z) \\ E_{D,y}(x,y,z) \\ E_{D,z}(x,y,z) \end{bmatrix} \quad (26)$$

where the dagger † denotes the combination of the transpose operator and the complex conjugate operator.

In order to compute the electric field at the entrance pupil $E_P$ the combination/product of the illumination and target is modelled as an infinitely dense array of infinitesimal electrical current dipoles with an electrical current distribution that equals $\underline{J}_T(x, y)$. Accordingly the Fourier transform relationship describing diffraction form the target to entrance pupil may take the form:

$$\begin{bmatrix} E_{P,\rho}(k_x, k_y) \\ E_{P,\vartheta}(k_x, k_y) \\ E_{P,\varphi}(k_x, k_y) \end{bmatrix} = \quad (27)$$

$$\underline{\underline{\xi}}(k_x, k_y) \int\int_{-\infty}^{+\infty} \begin{bmatrix} J_{T,x}(x, y) \\ J_{T,y}(x, y) \\ J_{T,z}(x, y) \end{bmatrix} \exp\left(i\frac{2\pi}{\lambda}\begin{bmatrix} k_x \\ k_y \end{bmatrix}^\dagger \cdot \begin{bmatrix} x \\ y \end{bmatrix}\right) dx dy$$

$$\underline{\underline{\xi}}(k_x, k_y) = \begin{bmatrix} 0 & 0 & 0 \\ \frac{k_x k_z}{k_r} & \frac{k_y k_z}{k_r} & -k_r \\ -\frac{k_y}{k_r} & \frac{k_x}{k_r} & 0 \end{bmatrix}$$

Combining the above:

$$\begin{bmatrix} E_{D,x}(x, y, z) \\ E_{D,y}(x, y, z) \\ E_{D,z}(x, y, z) \end{bmatrix} = \quad (28)$$

$$\int\int_{-\infty}^{+\infty} \begin{bmatrix} E_{Q,x}(k_x, k_y, z) \\ E_{Q,y}(k_x, k_y, z) \\ E_{Q,z}(k_x, k_y, z) \end{bmatrix} \exp\left(-i\frac{2\pi}{\lambda}\begin{bmatrix} k_x \\ k_y \end{bmatrix}^\dagger \cdot \begin{bmatrix} x \\ y \end{bmatrix}\right) dk_x dk_y$$

$$\begin{bmatrix} E_{Q,x}(k_x, k_y, z) \\ E_{Q,y}(k_x, k_y, z) \\ E_{Q,z}(k_x, k_y, z) \end{bmatrix} = \underline{\underline{\Gamma}}(k_x, k_y) \cdot \Omega(k_x, k_y, z) \cdot \underline{\underline{\xi}}(k_x, k_y) \begin{bmatrix} J_{P,x}(k_x, k_y) \\ J_{P,y}(k_x, k_y) \\ J_{P,z}(k_x, k_y) \end{bmatrix} \quad (29)$$

$$\underline{\underline{\Gamma}}(k_x, k_y) = \begin{bmatrix} k_z & \frac{k_x k_z}{k_r} & -\frac{k_y}{k_r} \\ k_y & \frac{k_y k_z}{k_r} & \frac{k_x}{k_r} \\ k_z & -k_r & 0 \end{bmatrix}$$

$$\begin{bmatrix} J_{P,x}(k_x, k_y) \\ J_{P,y}(k_x, k_y) \\ J_{P,z}(k_x, k_y) \end{bmatrix} = \int\int_{-\infty}^{+\infty} \begin{bmatrix} J_{T,x}(x, y) \\ J_{T,y}(x, y) \\ J_{T,z}(x, y) \end{bmatrix} \exp\left(i\frac{2\pi}{\lambda}\begin{bmatrix} k_x \\ k_y \end{bmatrix}^\dagger \cdot \begin{bmatrix} x \\ y \end{bmatrix}\right) dx dy \quad (30)$$

Note that wavefront aberrations (transmission and/or phase) can additionally also be included this expression. If they are applied in the parallel, and a senkrecht polarization coordinate system is used for example, then the aberration matrix function may be positioned in between the matrices $\underline{\underline{\delta}}(k_x, k_y)\cdot$ and $\cdot\underline{\underline{\xi}}(k_x, k_y)$. Note that, in contrast to that assumed above, in general the aberration function is a four-dimensional function of both the pupil coordinates $k_x$, and $k_y$ and the spatial coordinates x and y.

Note that the matrix $\underline{\underline{\Gamma}}$ is a unitary matrix and that the discrete Fourier transform matrix is also a unitary matrix, and these two unitary matrices commute. Hence in Equation (29) the multiplication with the matrix may be swapped in position with the inverse discrete Fourier transform operation. Further, if the purpose is to numerically compute the detector intensity, see Equation (26), then the multiplication with matrix may also be omitted, as the detector intensity can be computed using the spherical polarization coordinate system.

Summary

Above it is proposed to use computational imaging (e.g., phase retrieval) in lithographic metrology applications (e.g., measuring a characteristic or parameter of interest such as overlay, focus, dose or one or more geometrical parameter values such as critical dimension, side wall angle, edge placement error or local critical dimension uniformity) on a target. Overlay may comprise a measure of misalignment of structures in different layers and/or within-layer overlay, i.e., a measure of misalignment of structures in a single layer, such as in a double patterning process.

In an embodiment, it is proposed to use prior (target) knowledge in phase retrieval so as to enable a relaxation of the optics specification (e.g., aberration performance). In most present phase retrieval applications, there is little (beforehand) knowledge of the subject being measured (for example in biological applications), hence no (or only limited) prior (target) knowledge can be exploited in the phase retrieval algorithm. Also, in most known phase retrieval applications bright field measurements are typically used, and as such extending such techniques to dark field illumination is unknown. Applying a vector total variation based regularization function to one or more complex fields (i.e. amplitude and phase data instead of intensity data) is presently unknown, as such functions are believed to have been only applied to real fields (such as an intensity image) up till now. The one or more complex fields may comprise a complex field for each electric dipole current component/orientation (i.e. x, y or z) per illumination wavelength and polarization combination.

Advantages of the proposed methods include the following:

A wavelength coupling is provided, i.e., a coupling of corresponding measurements of a target under different illumination conditions. This wavelength coupling enables exploitation of multi-wavelength (or multi-illumination condition) measurements of one identical target (i.e. to couple wavelengths), without the need to introduce dispersion models (also known as n&k models) in μDBO (micro-diffraction based overlay) applications. Such dispersion models describe the relationship of refractive index n and/or extinction coefficient k through wavelength. However, as described above, dispersion models may optionally be used to reduce the number of degrees of freedom.

The wavelength coupling can be used to suppress coherent imaging artifacts such as image speckle or ringing artifacts by introducing an averaging.

The phase retrieval algorithm specifically disclosed above has a convergence guarantee (under certain suitable conditions not further discussed here), unlike many other known phase retrieval algorithms.

The fact that a target electric field replaces the detector intensity image in the above disclosure allows for additional advantages. This applies whether the target electric field is measured using e.g., computational phase retrieval or measured directly using holography. These additional advantages include:

Digital refocusing of the target is possible, after it has been measured.

A target electric field can be computationally re-imaged under different conditions using the methods described above; the different conditions including inter alia: different detection optics, aperture mask conditions and/or illumination conditions.

In case of a thin resist target for example, the resulting phase might provide a better source of overlay information than the resulting amplitude/intensity.

Currently, it is possible to obtain a detector intensity image for different wavelengths, bandwidths, illumination coherence states and/or different illumination polarization states and/or detector analyzer polarization states. It now also becomes possible to introduce the following extra variations, which allow to measure more/different information from one individual target:

Defocus of the target (note that this is not possible when the detector is located in a pupil plane).

Aberration and/or speckle and/or spatial coherence and/or temporal coherence perturbations of the illumination spot.

Aberration perturbations of the detection optics.

In a typical metrology device sensor, a significant amount of sensor optics is needed/used. The computational propagation of the electric and/or magnetic field allows computational generation of both a pupil image and field image without the need to measure both. This allows for a reduction in the sensor optics, and therefore may allow for volume and cost reduction and/or allow for provision of multiple sensors in parallel, to further reduce measurement time and/or increase sampling density of a substrate.

The specific phase retrieval algorithm described above is well suited to be implemented efficiently on a graphics processing unit (GPU) for example. No linear system of equations needs to be solved. The evaluation of the prior knowledge part of the loss function can be done on a pixel to pixel basis, leading to an embarrassingly parallel problem for that part of the loss function. For the data fidelity part of the loss function, the amount of computations will be dominated by computing FFTs (Fast Fourier Transforms). Also the memory footprint of the phase retrieval algorithm is not large.

Other embodiments are disclosed in the subsequent clauses:

i. A metrology apparatus for determining a characteristic of one or more structures on a substrate, the metrology system comprising a sensor to detecting characteristics of electromagnetic radiation being reflected or scattered by the one or more structures, a processor being configured to receive the detected characteristics of the electromagnetic radiation, determine phase and amplitude of an electric field in the vicinity of the one or more structures on the substrate, using the determined phase and amplitude of the electric field to determine the characteristic.

ii. A metrology system according to clause i, wherein the processor uses a feasibility problem approach, such as for example a Gerchberg-Saxton algorithm, to determine the phase and the amplitude.

iii. A metrology system according to clause i, wherein the processor is configured to determine the phase and amplitude by a) defining an optimization problem based on the detected characteristics of the electromagnetic radiation, a model of the interaction of the radiation with the one or more structures and knowledge of the radiation impinging on the one or more structures at the moment that the sensor detected the characteristics of the electromagnetic radiation; and b) finding a solution for the optimization problem.

iv. A metrology system according to clause iii, wherein the processor is further configured to use knowledge of the one or more structures on the substrate to determine the phase and amplitude.

v. A metrology system according to clause iii or iv, wherein regularization is used to introduce the knowledge of the one or more structure in in the optimization problem.

vi. A metrology system according to clause v, wherein the processor is configured to define the optimization problem that comprises a gradient based minimization of a loss function.

vii. A metrology system according to clause vi, wherein the processor is configured to define the loss function that comprises a sum of a data fidelity function and a prior knowledge regularization function.

viii. A metrology system according to any of the claims iii to vii, wherein the processor is configured to use complex numbers in the defining of the optimization problem and the finding an optimum of the optimization problem ix. A metrology system according to any preceding clause, wherein the sensor is arranged in or near one of: a pupil plane of an optical system, a plane that is conjugate with the pupil plane of the optical system and an image plane of the optical system.

x. A metrology system according to any of the clauses i to ix, wherein the sensor is arranged in or near the far field of the one of more structures on the substrate and the metrology system is configured to provide free space propagation for radiation propagating from the one or more structure on the substrate towards the sensor.

xi. A metrology system according to any preceding clause, comprising an illumination system for illuminating the one or more structures on the substrate, the illumination system comprising a radiation source, the radiation source is one of a spatially coherent light source, a spatially incoherent light source and a spatially incoherent light source.

xii. A metrology system according to any preceding clause, wherein the characteristics of the one or more structures on the substrate comprise at least one of an overlay value of structures in different layers of the one or more structures, one or more geometrical parameter values of 2d or 3d structures of the one or more structures, for example, a critical dimension of the one or more structures, a side wall angle of the one or more structures, an edge placement error of the one or more structures, or a local critical dimension uniformity value of the one or more structures, an operational parameter of an apparatus that manufactured the one or more structures on the substrate, for example, a focus value relating to a focus of a lithographic apparatus that manufactured the one or more structures, or a dose value relating to a dose being used by the lithographic apparatus that manufactured the one or more structures.

xiii. Method of determining a characteristic of one or more structures on a substrate, the method comprising detecting characteristics of electromagnetic radiation that is reflected or scattered by the one or more structures, determining phase and amplitude of an electric field in the vicinity of the one or more structures on the substrate, using the determined phase and amplitude of the electric field to determine the characteristic.

Further embodiments are disclosed in the subsequent numbered clauses:

1. A metrology system for determining a characteristic of interest relating to at least one structure on a substrate, the metrology system comprising:
   a processor being configured to:
      computationally determine phase and amplitude information from a detected characteristic of scattered radiation.
2. A metrology system as defined in clause 1 wherein the scattered radiation has been reflected or scattered by the at least one structure as a result of illumination of said at least one structure with illumination radiation in a measurement acquisition.
3. A metrology system as defined in clause 1 or 2, the processor being further configured to use the determined phase and amplitude to determine the characteristic of interest.
4. A metrology system as defined in any preceding clause, wherein the processor is configured such that said computationally determining phase and amplitude information comprises computationally determining the phase and amplitude of an electric and/or magnetic field and/or source representing the at least one structure.
5. A metrology system as defined in clause 4, wherein the processor is further configured to:
   model the effect of interaction between the illumination radiation and the at least one structure on the scattered radiation to obtain a modelled characteristic of the scattered radiation; and
   optimize the phase and amplitude of the electric field so as to minimize the difference between the modelled characteristic of the scattered radiation and the detected characteristic of the scattered radiation.
6. A metrology system as defined in clause 5, wherein said model is operable to model the effect of interaction between the illumination radiation and the at least one structure as an dense array of small electrical and/or magnetic current dipoles, wherein, optionally, the dense array is an infinitely dense array, and wherein, optionally, the small electric and/or magnetic current dipoles are infinitesimal.
7. A metrology system as defined in clause 6, wherein the dense array of small electrical current dipoles are modelled on a two-dimensional plane.
8. A metrology system as defined in clause 5, 6 or 7, wherein the metrology system comprises one or more optical elements between the at least one structure and a detection plane where the scattered radiation is detected, and the processor is configured to additionally model the effect of said one or more optical elements on the scattered radiation to obtain the modelled characteristic of the scattered radiation.
9. A metrology system as defined in any of clauses 5 to 8, wherein the processor is configured to use prior knowledge of the at least one structure to optimize the phase and amplitude of the electric field.
10. A metrology system as defined in clause 9, wherein the processor is configured to use at least a part of the prior knowledge of the at least one structure as a regularization to and/or a constraint on the optimization of the phase and amplitude of the electric field.
11. A metrology system as defined in clause 10, wherein said regularization and/or constraint comprises a total variation based regularization and/or constraint.
12. A metrology system as defined in clause 10, wherein said regularization and/or constraint comprises a vector total variation based regularization and/or constraint.
13. A metrology system as defined in any of clauses 10 to 12, wherein said regularization and/or constraint imposes a coupling between different sets of values of the phase and amplitude information for the at least one structure, each set of values relating to a different illumination condition.
14. A metrology system as defined in clause 13, wherein the processor is operable to computationally determine said different sets of values of the phase and amplitude information simultaneously thereby suppressing coherent imaging artifacts such as image speckle and/or ringing artifacts.
15. A metrology system according to any of clauses 10 to 14, wherein the processor is configured to:
   define a loss function that describes the difference between the modelled characteristic of the scattered radiation and the detected characteristic of the scattered radiation; and
   minimize said loss function using at least a part of the prior knowledge of the at least one structure as a regularization and/or constraint on said minimization.
16. A metrology system according to any of clauses 10 to 15, wherein the processor is configured to define a loss function that comprises a sum of a data fidelity function and a prior knowledge regularization function, the data fidelity function describing the difference between the modelled characteristic of the scattered radiation and the detected characteristic of the scattered radiation which is to be minimized and the prior knowledge regularization function being operable to perform said regularization and/or constrain the minimization.
17. A metrology system according to clause 16, wherein the processor is configured to define said minimization as a gradient method based minimization of the loss function or a Newton's method based minimization of the loss function.
18. A metrology system according to clause 17, wherein the processor is configured to use the dominant singular value of the Jacobian matrix relating to the prior knowledge regularization function, as the gradient magnitude or an approximation thereof in the gradient based minimization of the loss function.
19. A metrology system according to clause 17, wherein the processor is configured to use a suitable function of the singular values and/or the eigenvalues of a Jacobian matrix relating to the prior knowledge regularization function, in the gradient based minimization of the loss function.
20. A metrology system according to any of clauses 16 to 19, wherein the processor is configured to:
   model variation in refractive index of the at least one structure against wavelength and/or polarization and/or propagation direction to determine a dispersion model of structure; and
   use the prior knowledge regularization function on input coefficients of said dispersion model.
21. A metrology system according to any of clauses 10 to 20, wherein said regularization and/or constraint comprises a minimum description length based regularization or constraint which imposes a bias against complex solutions to the optimization.
22. A metrology system according to clause 21, wherein said minimum description length based regularization or constraint comprises a Kolmogorov complexity based regularization and/or constraint.
23. A metrology system according to any of clauses 10 to 22, wherein said regularization or constraint comprises a matrix rank or nuclear norm based regularization and/or constraint which imposes a low-rank constraint or an approximation thereof on the solution to the optimization.
24. A metrology system according to any of clauses 10 to 23, wherein the processor is configured to use a search library to constrain solutions to the optimization to only those which are a linear combination of library images of the at least one structure comprised within the search library.
25. A metrology system according to any of clauses 10 to 25, wherein the processor is configured such that said regularization is further based on different sets of values of the phase and amplitude information for the at least one structure, each set of values relating to a different focus setting, said metrology system comprising an electrical tunable lens for changing the focus settings without changing the relative displacement between structure and sensor.
26. A metrology system according to any of clauses 5 to 25, wherein the processor is configured to use complex numbers in the defining and performance of said optimization of the phase and amplitude of the electric field.
27. A metrology system according to any preceding clause, wherein the processor is further configured to simultaneously computationally determine the phase and amplitude information for multiple images of the target, each image corresponding to a different diffraction order.
28. A metrology system according to any preceding clause, wherein the processor is further configured to computationally re-image the measurement acquisition of the at least one structure subsequent to a measurement to obtain at least one computationally re-imaged image.
29. A metrology system according to clause 28, wherein said computationally re-imaging the measurement acquisition comprises one or more of:
digitally altering one or more illumination characteristics, which may include: the illumination coherence or coherence at target level, the illumination profile, the illumination spectrum shape, the illumination polarization, and/or digitally imposing polarization and/or apodization;
digitally altering one or more characteristics of the detection optics, which may include: changing a numerical aperture of the detection optics, changing any other characteristic of an optical component of the detection optics, changing an aberration characteristic of an optical component of the detection optics, filtering in the detection optics;
digitally altering a focus setting of an image.
30. A metrology system according to clause 28 or 29, wherein the processor is further configured to:
computationally re-image the measurement acquisition of the at least one structure subsequent to a measurement for a plurality of different virtual settings of a parameter to obtain a plurality of computationally re-imaged images, and
average the plurality of computationally re-imaged images to obtain an averaged computationally re-imaged image.
31. A metrology system according to claim 30, wherein the processor is further configured to apply a positive, zero or negative weight to each of the computationally re-imaged images to obtain a weighted averaged computationally re-imaged image, the weights for all the computationally re-imaged images having a sum of one.
32. A metrology system according to any preceding clause, wherein the processor uses a feasibility problem approach, such as for example a Gerchberg-Saxton algorithm, to determine the phase and the amplitude.
33. A metrology system according to any preceding clause, further comprising one or more sensors for detecting characteristics of said scattered radiation subsequent to it having been reflected or scattered by the at least one structure.
34. A metrology system according to claim 33, wherein the metrology apparatus is configured to prevent a transmission of a zeroth diffraction order of said scattered radiation towards the one or more sensors.
35. A metrology system according to clause 33 or 34, wherein at least one of said one or more sensors is arranged in or near one of: a pupil plane of an optical system or a plane that is conjugate with the pupil plane of the optical system.
36. A metrology system according to clause 33 or 35, wherein at least one of said one or more sensors is arranged in an image plane of the optical system or a plane that is conjugate with the image plane.
37. A metrology system according to clause 33, 34, 35 or 36, wherein at least one of said one or more sensors is arranged in or near the far field of the at least one structure and the metrology system is configured to provide free space propagation for the scattered radiation propagating from the at least one structure towards the sensor.
38. A metrology system according to any of clauses 1 to 35, wherein the metrology system is operable to perform a measurement acquisition on the at least one structure with a plurality of different levels of focus; and
use the results of each of these measurement acquisitions to determine the characteristic of interest.
39. A metrology system according to any preceding clause, wherein the processor is further configured to computationally refocus the measurement acquisition of the at least one structure subsequent to a measurement.
40. A metrology system according to any preceding clause, comprising an illumination system for illuminating the at least one structure on the substrate, the illumination system comprising a radiation source, the radiation source being one of: a spatially coherent light source, a spatially incoherent light source and a spatially partially coherent light source.
41. A metrology system according to any preceding clause, configured to determine aberration and/or speckle perturbations in an illumination profile of the illumination radiation on the at least one structure; and wherein the processor is configured to use the determined aberration and/or speckle perturbations in determining the characteristic of interest.
42. A metrology system according to any preceding clause, configured to determine aberration perturbations in the detection optics; and wherein the processor is configured to use the determined aberration perturbations in determining the characteristic of interest.

43. A metrology system according to any preceding clause, wherein the processor is further configured to computationally determine the phase and amplitude for different illumination conditions than those actually used in performing a measurement acquisition.
44. A metrology system according to any preceding clause, wherein the characteristic of interest comprises one or more of:
    an overlay value relating to a misalignment of substructures in different layers of the at least one structure,
    a focus value relating to a focus of a lithographic apparatus that manufactured the at least one structure, and
    a dose value relating to a dose being used by the lithographic apparatus that manufactured the at least one structure.
45. A metrology system according to any of clauses 1 to 43, wherein the characteristic of interest comprises one or more geometrical parameter values of the at least one structure, wherein said one or more geometrical parameter values includes one or more of: a critical dimension relating to the at least one structure, a side wall angle relating to the at least one structure, an edge placement error relating to the at least one structure, or a local critical dimension uniformity value relating to the at least one structure.
46. A metrology system according to any preceding clause, wherein the metrology system is operable to perform dark field measurements such that a zeroth order of the scattered radiation is completely or partially blocked, and the phase information and characteristic of interest is determined from at least one pair of higher positive and negative diffraction orders of the scattered radiation.
47. A method of determining a characteristic of interest relating to at least one structure on a substrate, method comprising:
    computationally determining phase and amplitude information from a detected characteristic of scattered radiation.
48. A method as defined in clause 47, wherein the scattered radiation has been reflected or scattered by the at least one structure as a result of illumination of said at least one structure with illumination radiation in a measurement acquisition.
49. A method as defined in clause 47 or 48 further comprising using the determined phase and amplitude to determine the characteristic of interest.
50. A method as defined in clause 47, 48 or 49, wherein computationally determining phase and amplitude information comprises computationally determining the phase and amplitude of an electric and/or magnetic field representing the at least one structure.
51. A method as defined in clause 50, comprising:
    modeling the effect of interaction between the illumination radiation and the at least one structure on the scattered radiation to obtain a modelled characteristic of the scattered radiation; and
    optimizing the phase and amplitude of the electric field so as to minimize the difference between the modelled characteristic of the scattered radiation and the detected characteristic of the scattered radiation.
52. A method as defined in clause 51, comprising modeling the at least one structure as an dense array of small electrical and/or magnetic current dipoles on a two-dimensional plane, wherein, optionally, the dense array is an infinitely dense array, and wherein, optionally, the small electric and/or magnetic current dipoles are infinitesimal.
53. A method as defined in clause 51 or 52, wherein there is one or more optical elements between the at least one structure and a detection plane where the scattered radiation is detected, the method comprising additionally modeling the effect of said one or more optical elements on the scattered radiation to obtain the modelled characteristic of the scattered radiation.
54. A method as defined in any of clauses 51 to 53, comprising using prior knowledge of the at least one structure to optimize the phase and amplitude of the electric field.
55. A method as defined in clause 54, comprising using the prior knowledge of the at least one structure as a regularization to and/or a constraint on the optimization of the phase and amplitude of the electric field by:
    defining a loss function that describes the difference between the modelled characteristic of the scattered radiation and the detected characteristic of the scattered radiation; and
    minimizing said loss function using the prior knowledge of the at least one structure as the regularization and/or constraint on said minimization.
56. A method as defined in clause 54 or 55 wherein said regularization and/or constraint imposes a coupling between different sets of values of the phase and amplitude information for the at least one structure, each set of values relating to a different illumination condition.
57. A method according to any of clauses 54 to 56, comprising defining a loss function that comprises a sum of a data fidelity function and a prior knowledge regularization function, the data fidelity function describing the difference between the modelled characteristic of the scattered radiation and the detected characteristic of the scattered radiation which is to be minimized and the prior knowledge regularization function being operable to perform said regularization and/or constrain the minimization.
58. A method according to any of clauses 54 to 57, wherein said regularization and/or constraint comprises one or more of:
    a minimum description length based regularization and/or constraint which imposes a bias against complex solutions to the optimization; or
    a matrix rank or nuclear norm based regularization and/or constraint which imposes a low-rank constraint on the solution to the optimization.
59. A method according to any of clauses 51 to 58, comprising use complex numbers in the defining and performance of said optimization of the phase and amplitude of the electric field.
60. A method according to any of clauses 47 to 59, comprising sensing the scattered radiation, wherein sensing is performed in or near one or more of:
    a pupil plane of an optical system or a plane that is conjugate with the pupil plane of the optical system;
    an image plane of the optical system; and/or
    in or near the far field of the at least one structure so as to provide free space propagation for the scattered radiation propagating from the at least one structure towards the sensor.

61. A method according to any of clauses 47 to 60, comprising:
  performing a measurement acquisition on the at least one structure with a plurality of different levels of focus; and
  using the results of each of these measurement acquisitions to determine the characteristic of interest.
62. A method according to any of clauses 47 to 61, comprising computationally refocusing the measurement acquisition of the at least one structure subsequent to a measurement.
63. A method according to any of clauses 47 to 62, comprising simultaneously computationally determine the phase and amplitude information for multiple images of the target, each image corresponding to a different diffraction order.
64. A method according to any of clauses 47 to 63, comprising computationally determining the phase and amplitude for different illumination conditions than those actually used in performing a measurement acquisition.
65. A method according to any of clauses 47 to 64, comprising computationally re-imaging the measurement acquisition of the at least one structure subsequent to a measurement to obtain at least one computationally re-imaged image.
66. A method according to clause 65, wherein said computationally re-imaging the measurement acquisition comprises one or more of:
  digitally altering one or more illumination characteristics, which may include: the illumination coherence, the target coherence, the illumination profile, the illumination spectrum shape, the illumination polarization, and/or digitally imposing polarization and/or apodization;
  digitally altering one or more characteristics of the detection optics, which may include: changing a numerical aperture of the detection optics, changing any other characteristic of an optical component of the detection optics, changing an aberration characteristic of an optical component of the detection optics, filtering in the detection optics;
digitally altering a focus setting of an image.
67. A method according to clause 64 or 65, comprising:
  computationally re-imaging the measurement acquisition of the at least one structure subsequent to a measurement for a plurality of different virtual settings of a parameter to obtain a plurality of computationally re-imaged images, and
  averaging the plurality of computationally re-imaged images to obtain an averaged computationally re-imaged image.
68. A method according to clause 67, comprising applying a positive, zero or negative weight to each of the computationally re-imaged images to obtain a weighted averaged computationally re-imaged image, the weights for all the computationally re-imaged images having a sum of one.
69. A method according to any of clauses 47 to 68, wherein the characteristic of interest comprises one or more of:
  an overlay value relating to a misalignment of sub-structures in different layers of the at least one structure,
  an overlay value relating to a misalignment of sub-structures in the same layer of the at least one structure in a multi-patterning process;
  a focus value relating to a focus of a lithographic apparatus that manufactured the at least one structure,
  a dose value relating to a dose being used by the lithographic apparatus that manufactured the at least one structure; and/or
  one or more geometrical parameter values of the at least one structure, wherein said one or more geometrical parameter values includes one or more of: a critical dimension relating to the at least one structure, a side wall angle relating to the at least one structure, an edge placement error relating to the at least one structure, or a local critical dimension uniformity value relating to the at least one structure.
70. A non-transitory computer program product comprising machine-readable instructions for causing a processor to cause performance of the method of any of clauses 47 to 69.
71. A metrology apparatus for determining a characteristic of interest relating to at least one structure on a substrate, the metrology apparatus comprising at least one of
  one or more radiation sources being operable of generating radiation in an emission wavelength range that at least partially overlaps with a wavelength range from 200 to 2000 nm, or, optionally, the emission wavelength range at least overlaps with half of the wavelength range from 200 nm to 2000 nm,
  an optical system being operable of transmitting or reflecting radiation in the wavelength range from 200 nm to 2000 nm, or, optionally, the optical system being operable of transmitting or reflecting radiation in at least half of the wavelength range from 200 nm to 2000 nm, or, optionally, the optical system being operable of transmitting or reflecting radiation in at least ¾ of the wavelength range from 200 nm to 2000 nm,
  the optical system being operable to illuminate the structure with a Numerical Aperture (NA) larger than 0.4, larger than 0.6, larger than 0.7, or, optionally, larger than 0.8,
  the optical system being operable to capture reflected and/or scattered radiation with an detection optical sub-system and wherein the detection optical sub-system has a Numerical Aperture (NA) larger than 0.4, larger than 0.6, larger than 0.7, or, optionally, larger than 0.8,
  the optical system having an aberration larger than the used illumination wavelength ($\lambda$) divided by 20,
  the optical system being operable to illuminate the structure with a Field of View (FoV) larger than 40 by 40 micrometer, or optionally larger than 50 by 50 micrometer, or optionally larger than 75 by 75 micrometer
  the optical system having a transmission or reflectivity of at least 25%, or optionally at least 75%, from the one or more radiation sources towards the structure,
  the optical system having a transmission or reflectivity of at least 70%, or optionally at least 75%, for reflected and/or scattered radiation from the structure towards one or more sensors for recording characteristics of the reflected and/or scattered radiation.
72. A metrology apparatus according to clause 71 further comprising an optical system being configured to only transmit one or more higher diffraction orders towards a sensor.

73. A metrology apparatus according to clause 72 wherein the optical system further comprises a blocking means being operable to block a zeroth diffraction order being reflected by the structure on the substrate when the structure is illuminated with radiation.

74. A metrology apparatus according to any one of the clauses 71 to 73, further comprising a processor being configured to execute any one of the methods of clauses 47 to 69.

75. A metrology system according to any one of the clauses 1 to 46 comprising a metrology apparatus according to any one of the clause 71 to 74.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device).

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch P of the metrology targets is close to the resolution limit of the optical system of the scatterometer, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An apparatus for determining a characteristic of interest relating to at least one structure on a substrate, the apparatus comprising:
   an illumination branch comprising a radiation source and configured to direct illumination radiation at the substrate;
   a detection branch comprising a detector and configured to detect scattered radiation from the at least one structure on the substrate; and
   a processor configured to:
      computationally determine phase and amplitude information from an electric field of the scattered radiation in a measurement acquisition, and
      computationally re-image the measurement acquisition of the at least one structure to obtain at least one computationally re-imaged image,
      wherein computationally re-imaging the measurement acquisition comprises digitally altering an apodization of the measurement acquisition, and
      wherein the digitally altering the apodization is based on a characteristic corresponding to the at least one structure.

2. The apparatus of claim 1, wherein the digitally altering the apodization comprises digitally altering an apodization in the detection branch.

3. The apparatus of claim 2, wherein the computationally re-imaging the measurement acquisition comprises digitally altering an apodization of the scattered radiation for the measurement acquisition.

4. The apparatus of claim 2, wherein the digitally altering the apodization comprises applying a non-physical apodizer, wherein the non-physical apodizer is digitally modeled in or near a pupil plane of the detection branch.

5. The apparatus of claim 1, wherein the digitally altering the apodization comprises digitally altering an apodization in the illumination branch.

6. The apparatus of claim 5, wherein the computationally re-imaging the measurement acquisition comprises digitally altering an apodization of the illumination radiation for the measurement acquisition.

7. The apparatus of claim 5, wherein the digitally altering the apodization comprises applying a non-physical apodizer, wherein the non-physical apodizer is digitally modeled in or near a pupil plane of the illumination branch.

8. The apparatus of claim 1, wherein the digitally altering the apodization comprises dynamically tuning the apodization.

9. The apparatus of claim 8, wherein the dynamically tuning the apodization is based on the characteristic of interest.

10. The apparatus of claim 8, wherein the dynamically tuning the apodization is based on a point spread function of the apparatus.

11. A method of determining a characteristic of interest relating to at least one structure on a substrate, the method comprising:
   computationally determining phase and amplitude information from an electric field of scattered radiation in a measurement acquisition; and
   computationally re-imaging the measurement acquisition of the at least one structure to obtain at least one computationally re-imaged image,
   wherein the computationally re-imaging the measurement acquisition comprises digitally altering an apodization of the measurement acquisition, and
   wherein the digitally altering the apodization is based on a characteristic corresponding to the at least one structure.

12. The method of claim 11, wherein the digitally altering the apodization comprises digitally altering an apodization in a detection branch configured to detect the scattered radiation.

13. The method of claim 12, wherein the computationally re-imaging the measurement acquisition comprises digitally altering an apodization of the scattered radiation for the measurement acquisition.

14. The method of claim 12, wherein the digitally altering the apodization comprises applying a non-physical apodizer, wherein the non-physical apodizer is digitally modeled in or near a pupil plane of the detection branch.

15. The method of claim 11, wherein the digitally altering the apodization comprises digitally altering an apodization in an illumination branch configured to direct illumination radiation at the substrate.

16. The method of claim 15, wherein the computationally re-imaging the measurement acquisition comprises digitally altering an apodization of the illumination radiation for the measurement acquisition.

17. The method of claim 15, wherein the digitally altering the apodization comprises applying a non-physical apodizer, wherein the non-physical apodizer is digitally modeled in or near a pupil plane of the illumination branch.

18. The method of claim 11, wherein the digitally altering the apodization comprises dynamically tuning the apodization.

19. The method of claim 18, wherein the dynamically tuning the apodization is based on the characteristic of interest.

20. A non-transitory computer program product comprising machine-readable instructions for causing a processor to cause performance of the method of claim 11.

\* \* \* \* \*

UNITED STATES PATENT AND TRADEMARK OFFICE
CERTIFICATE OF CORRECTION

| | |
|---|---|
| PATENT NO. | : 12,366,811 B2 |
| APPLICATION NO. | : 18/650790 |
| DATED | : July 22, 2025 |
| INVENTOR(S) | : Tinnemans et al. |

It is certified that error appears in the above-identified patent and that said Letters Patent is hereby corrected as shown below:

In the Specification

In Column 1, Line 10, delete "2022," and insert -- 2022, now U.S. Pat. No. 12,007,700, issued Jun. 11, 2024, --, therefor.

In Column 6, Line 31, delete "scatterometter" and insert -- scatterometer --, therefor.

In Column 6, Line 62, delete "2)" and insert -- $\lambda$) --, therefor.

In Column 7, Line 36, delete "the" and insert -- by the --, therefor.

In Column 8, Line 29, delete "incidence a" and insert -- incidence $\alpha$ --, therefor.

In Column 8, Line 36, delete "angle 2a" and insert -- angle 2$\alpha$ --, therefor.

In Column 9, Line 36, delete "a to" and insert -- $\alpha$ to --, therefor.

In Column 9, Line 66, delete "US20160161863," and insert -- US 20160161863, --, therefor.

In Column 10, Line 7, delete "may a" and insert -- may be a --, therefor.

In Column 10, Line 25, delete "offsets+d" and insert -- offsets +d --, therefor.

In Column 10, Line 56, delete "US20160161863," and insert -- US 20160161863, --, therefor.

In Column 11, Line 58, delete "image of" and insert -- image --, therefor.

In Column 14, Line 5, delete "intensity/(in" and insert -- intensity I (in --, therefor.

In Column 15, Line 20, delete "bandwith," and insert -- bandwidth, --, therefor.

Signed and Sealed this
Second Day of September, 2025

Coke Morgan Stewart
*Acting Director of the United States Patent and Trademark Office*

CERTIFICATE OF CORRECTION (continued)
U.S. Pat. No. 12,366,811 B2

In Column 18, Line 37, delete "training to." and insert -- training. --, therefor.

In Column 18, Line 50, delete "condition." and insert -- condition, --, therefor.

In Column 21, Lines 62-63, delete

"$g_T(u) = \|[\partial_x \underline{\underline{\Gamma}}_T(x_w, y_u) \ \partial_y \underline{\underline{\delta}}_T(x_w, y_u)]\|_*$" and insert -- $g_T(u) = \|[\partial_x \underline{\underline{\Gamma}}_T(x_w, y_u) \ \partial_y \underline{\underline{\Gamma}}_T(x_w, y_u)]\|_*$. --, therefor.

In Column 22, Line 18, delete "$\underline{\underline{\check{\Gamma}}}_T = \underset{\underline{\underline{\Gamma}}_T}{\arg\min}(L)$" and insert -- $\underline{\underline{\check{\Gamma}}}_T = \underset{\underline{\underline{\Gamma}}_T}{\arg\min}(L)$ --, therefor.

In Column 22, Lines 32-34, delete "$G_T(\underline{\underline{L}} \cdot \underline{\underline{\Gamma}}_T) = \sum_{m=1}^{UV} \sigma_1((\underline{\underline{L}} \cdot \underline{\underline{\Gamma}}_T)_{(\{m,m+UV\},:)})$" and insert -- $G_T(\underline{\underline{L}} \cdot \underline{\underline{\Gamma}}_T) = \sum_{m=1}^{UV} \sigma_1((\underline{\underline{L}} \cdot \underline{\underline{\Gamma}}_T)_{(\{m,m+UV\},:)})$ --, therefor.

In Column 23, Line 65, delete "subscript$_T$" and insert -- subscript $_T$ --, therefor.

In Column 24, Lines 23-33, delete "$(prox_{\phi G_T^*}(\underline{\underline{\Omega}}_T))_{(\{m,m+UV\},:)} = \underset{\underline{\underline{X}}}{\arg\min}\{\iota_\mathcal{B}(\underline{\underline{X}}) + \frac{1}{2\phi}\|\underline{\underline{X}} - (\underline{\underline{\Omega}}_T)_{(\{m,m+UV\},:)}\|_F^2\}$ $\iota_\mathcal{B}(\underline{\underline{X}}) = \begin{cases} 0 & \text{if } \underline{\underline{X}} \in \mathcal{B} \\ \infty & \text{if } \underline{\underline{X}} \notin \mathcal{B} \end{cases}$" and insert -- $(prox_{\phi G_T^*}(\underline{\underline{\Omega}}_T))_{(\{m,m+UV\},:)}$
$= \underset{\underline{\underline{X}}}{\arg\min}\{\iota_\mathcal{B}(\underline{\underline{X}}) + \frac{1}{2\phi}\|\underline{\underline{X}} - (\underline{\underline{\Omega}}_T)_{(\{m,m+UV\},:)}\|_F^2\}$
$\iota_\mathcal{B}(\underline{\underline{X}}) = \begin{cases} 0 & \text{if } \underline{\underline{X}} \in \mathcal{B} \\ \infty & \text{if } \underline{\underline{X}} \notin \mathcal{B} \end{cases}$ --, therefor.

In Column 24, Line 40, delete "$\in \mathbb{C}^{2 \times 3 \ W}$." and insert -- $\in \mathbb{C}^{2 \times 3W}$. --, therefor.

In Column 24, Line 55, delete "Gr)" and insert -- $G_T$) --, therefor.

CERTIFICATE OF CORRECTION (continued)
U.S. Pat. No. 12,366,811 B2

In Column 25, Line 52, delete "am" and insert -- $a_m$ --, therefor.

In Column 25, Line 53, delete "ζ$_m$" and insert -- ς$_m$ --, therefor.

In Column 25, Line 54, delete "(0 < ζ$_m$ < 1)" and insert -- ( 0 < ς$_m$ < 1) --, therefor.

In Column 27, Line 2, delete "form" and insert -- from --, therefor.

In Column 27, Lines 29-33, delete "
$$\underline{\underline{\Gamma}}(k_x, k_y) = \begin{bmatrix} k_z & \frac{k_x k_z}{k_r} & -\frac{k_y}{k_r} \\ k_y & \frac{k_y k_z}{k_r} & \frac{k_x}{k_r} \\ k_z & -k_r & 0 \end{bmatrix}$$
" and insert --
$$\underline{\underline{\Gamma}}(k_x, k_y) = \begin{bmatrix} k_x & \frac{k_x k_z}{k_r} & -\frac{k_y}{k_r} \\ k_y & \frac{k_y k_z}{k_r} & \frac{k_x}{k_r} \\ k_z & -k_r & 0 \end{bmatrix}$$
--, therefor.

In Column 27, Line 44, delete "$\underline{\underline{\delta}}(k_x, k_y) \cdot$" and insert -- $\underline{\underline{\Gamma}}(k_x, k_y) \cdot$ --, therefor.

In Column 29, Line 66, delete "in in" and insert -- in --, therefor.

In Column 30, Line 23, delete "one of more" and insert -- one or more --, therefor.

In Column 31, Line 40, delete "an dense" and insert -- a dense --, therefor.

In Column 36, Line 55, delete "use complex" and insert -- the use of complex --, therefor.

In Column 38, Line 44, delete "an detection" and insert -- a detection --, therefor.